United States Patent
Iizuka et al.

(10) Patent No.: US 11,961,784 B2
(45) Date of Patent: Apr. 16, 2024

(54) SEMICONDUCTOR DEVICE

(71) Applicant: Mitsubishi Electric Corporation, Tokyo (JP)

(72) Inventors: Arata Iizuka, Tokyo (JP); Korehide Okamoto, Fukuoka (JP); Ryoya Shirahama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 284 days.

(21) Appl. No.: 17/276,028

(22) PCT Filed: Nov. 19, 2018

(86) PCT No.: PCT/JP2018/042615
§ 371 (c)(1),
(2) Date: Mar. 12, 2021

(87) PCT Pub. No.: WO2020/105075
PCT Pub. Date: May 28, 2020

(65) Prior Publication Data
US 2022/0059432 A1 Feb. 24, 2022

(51) Int. Cl.
*H01L 23/40* (2006.01)
*H01L 23/31* (2006.01)
(Continued)

(52) U.S. Cl.
CPC .......... *H01L 23/4006* (2013.01); *H01L 23/31* (2013.01); *H01L 23/473* (2013.01); *H01L 23/5226* (2013.01)

(58) Field of Classification Search
CPC ... H01L 23/4006; H01L 23/31; H01L 23/473; H01L 23/5226; H01L 23/40;
(Continued)

(56) References Cited

U.S. PATENT DOCUMENTS

| 9,110,248 B2 * | 8/2015 | Arao ............... G02B 6/4268 |
| 2005/0051298 A1 | 3/2005 | Sakai |

(Continued)

FOREIGN PATENT DOCUMENTS

| JP | S48-32609 Y1 | 10/1973 |
| JP | H02-130860 A | 5/1990 |

(Continued)

OTHER PUBLICATIONS

An Office Action mailed by the Japan Patent Office dated Aug. 31, 2021, which corresponds to Japanese Patent Application No. 2020-557028 and is related to U.S. Appl. No. 17/276,028; with English translation.

(Continued)

*Primary Examiner* — Fazli Erdem
(74) *Attorney, Agent, or Firm* — Studebaker & Brackett PC

(57) ABSTRACT

A first heat sink has a first inner surface and a first outer surface, and has a first through hole. A second heat sink has a second inner surface disposed with a clearance left from the first inner surface of the first heat sink, and a second outer surface opposite to the second inner surface, and has a second through hole. A semiconductor element is disposed within a clearance between the first inner surface of the first heat sink and the second inner surface of the second heat sink. A sealing member seals the semiconductor element within the clearance between the first inner surface and the second inner surface. A first hollow tube is made of metal, and connects the first through hole and the second through hole.

20 Claims, 26 Drawing Sheets

(51) Int. Cl.
*H01L 23/473* (2006.01)
*H01L 23/522* (2006.01)

(58) Field of Classification Search
CPC ..... H01L 23/522; H01L 25/18; H01L 25/072; H01L 24/40; H01L 2224/84801; H01L 2224/29101; H01L 2224/37147; H01L 24/73; H01L 2224/37124; H01L 2224/83801; H01L 2924/181; H01L 2224/40095; H01L 23/3735; H01L 24/32; H01L 24/83; H01L 24/29; H01L 23/49811; H01L 2224/40139; H01L 2224/40225; H01L 2224/32225; H01L 2924/00012; H01L 2924/00014; H01L 2924/014; H01L 24/84
USPC ........................................................ 257/714
See application file for complete search history.

(56) References Cited

U.S. PATENT DOCUMENTS

| | | | |
|---|---|---|---|
| 2005/0133210 A1 | 6/2005 | Inagaki et al. | |
| 2008/0224303 A1 | 9/2008 | Funakoshi et al. | |
| 2010/0224990 A1 | 9/2010 | Suh et al. | |
| 2018/0286781 A1* | 10/2018 | Yoshihara | F28F 3/022 |

FOREIGN PATENT DOCUMENTS

| | | | | |
|---|---|---|---|---|
| JP | 2005-333008 A | | 12/2005 | |
| JP | 2005333008 A | * | 12/2005 | ............ H01L 23/40 |
| JP | 2014-120720 A | | 6/2014 | |
| JP | 2014120720 A | * | 6/2014 | ..... H01L 2924/0002 |
| JP | 2014-179376 A | | 9/2014 | |
| JP | 2014179376 A | * | 9/2014 | ............ H01L 24/01 |
| JP | 2016131197 | * | 7/2016 | ............ H01L 23/36 |
| JP | 2016-157733 A | | 9/2016 | |
| JP | 2016157733 A | * | 9/2016 | ........... H01L 23/473 |
| JP | 2017-092151 A | | 5/2017 | |
| JP | 2017092151 A | * | 5/2017 | ........... H01L 23/473 |

OTHER PUBLICATIONS

International Search Report issued in PCT/JP2018/042615; dated Jan. 15, 2019.

An Office Action mailed by China National Intellectual Property Administration dated Sep. 25, 2023, which corresponds to Chinese U.S. Appl. No. 17/276,028.1 and is related to U.S. Appl. No. 17/276,028; with English language translation.

An Office Action issued by the German Patent and Trademark Office on Feb. 23, 2024, which corresponds to German Patent Application No. 112018008151.6 and is related to U.S. Appl. No. 17/276,028.

* cited by examiner

F I G. 4
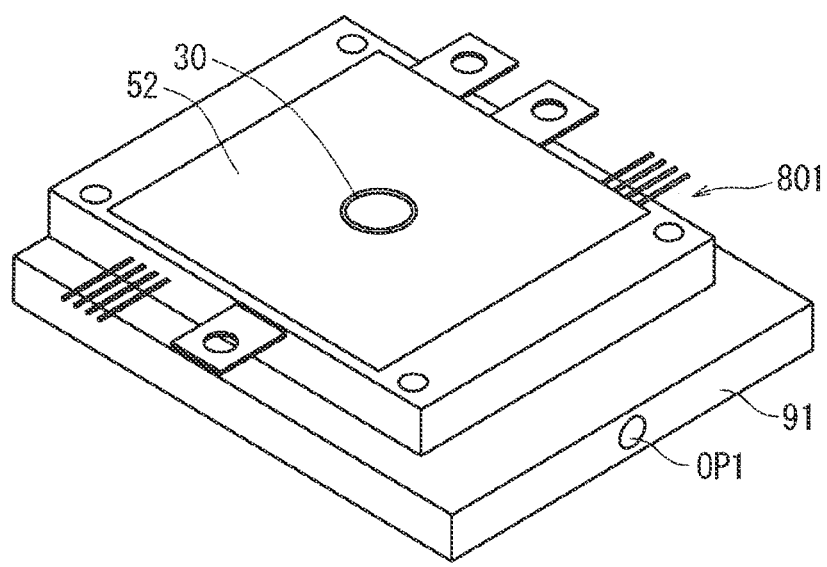

SEMICONDUCTOR DEVICE

TECHNICAL FIELD

The present invention relates to a semiconductor device, and particularly to a power semiconductor device having a heat sink.

BACKGROUND ART

In recent years, there has been a demand for miniaturizing a high output power module (semiconductor device) while maintaining high reliability. One method for meeting this demand is to apply a transfer molding technology to a high-power power module. In this case, a semiconductor element is sealed with resin (typically thermosetting resin such as epoxy resin) in the power module. Moreover, for meeting the demand for miniaturization of the power module, there has been developed a technology for increasing a capacity of the semiconductor element mounted on the power module. A large-capacity semiconductor element tends to have a high temperature during operation. Accordingly, a high-performance cooling mechanism that sufficiently cools the semiconductor element is required to maintain high reliability. For meeting the demand for miniaturization while increasing the cooling performance, a technology for providing a high-performance cooling mechanism without excessively increasing the size of the power module is required. For example, according to a technology described in Japanese Patent Application Laid-Open No. 02-130860 (1990) (Patent Document 1), a hole penetrating a package that seals an IC (Integrated Circuit) chip is formed, and a coolant is poured into the hole. This publication claims that cooling is effectively achievable by this method.

PRIOR ART DOCUMENT

Patent Document

Patent Document 1: Japanese Patent Application Laid-Open No. 02-130860 (1990)

SUMMARY

Problems to be Solved by the Invention

A direct water cooling technology is widely known as one of technologies for effectively cooling a power module. In a typical direct water cooling technology, a heat sink of a power module is directly cooled by a flow of cooling water (water or a mixture of water and antifreeze). When a resin as a sealing member, and cooling water as a "cooling agent" are used in the technology described in the above publication, moisture is absorbed by the sealing member in response to contact between the cooling water and the resin. As a result, reliability of the power module (semiconductor device) deteriorates. In addition, even if a cooling liquid containing no water is used, reliability may deteriorate as long as a reaction is caused between the cooling liquid and the resin.

The present invention has been developed to solve the aforementioned problems. An object of the present invention is to miniaturize a high-output semiconductor device while securing high reliability.

Means to Solve the Problem

The semiconductor device of the present invention has a first heat sink, a second heat sink, a semiconductor element, a first hollow tube, and a sealing member. The first heat sink has a first inner surface and a first outer surface opposite to the first inner surface, and has a first through hole between the first inner surface and the first outer surface. The second heat sink has a second inner surface disposed with a clearance left from the first inner surface of the first heat sink, and a second outer surface opposite to the second inner surface, and has a second through hole between the second inner surface and the second outer surface. The semiconductor element is disposed within a clearance between the first inner surface of the first heat sink and the second inner surface of the second heat sink. The sealing member seals the semiconductor element within the clearance between the first inner surface of the first heat sink and the second inner surface of the second heat sink. The first hollow tube is made of metal, and connects the first through hole of the first heat sink and the second through hole of the second heat sink.

Effects of the Invention

According to the present invention, the first heat sink and the second heat sink, which are thermally tightly connected to each other by the first hollow tube made of metal, are cooled by cooling water. Accordingly, high cooling performance is achievable. Therefore, the semiconductor device with high output is allowed to be operated. Moreover, the first hollow tube is used as a cooling water path. Accordingly, the cooling water path between the first heat sink and the second heat sink is allowed to be disposed without occupying a large space. Therefore, the semiconductor device can be miniaturized. Furthermore, the first hollow tube is made of metal. Accordingly, entrance of the cooling water into the sealing member by permeation into the first hollow tube is prevented. Therefore, reliability deterioration caused by absorption of the cooling water by the sealing member is avoidable. As apparent from the above, miniaturization of the high-output semiconductor device is achievable while securing high reliability.

Objects, features, aspects, and advantages of this invention will become more apparent with reference to following detailed description and accompanying drawings.

BRIEF DESCRIPTION OF DRAWINGS

FIG. 4 is a perspective view not including an illustration of a partial configuration of FIG. 2.

DESCRIPTION OF EMBODIMENTS

Embodiments of the present invention will be hereinafter described with reference to the drawings. In the following figures, the same or corresponding parts are given the same reference numbers, and explanation of these parts is not repeated.

First Embodiment (Outline of Configuration)

Figure 1:
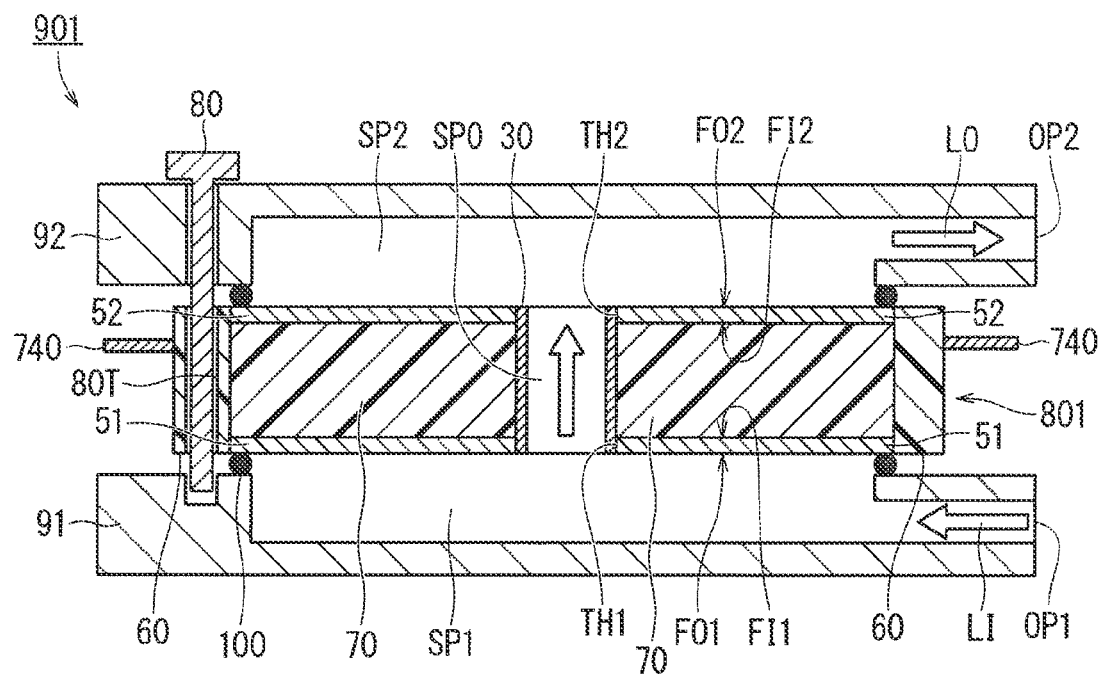
FIG. 1 is a cross-sectional view schematically showing a configuration of a semiconductor device (water-cooled module unit) according to a first embodiment of the present invention.
Figure 2:
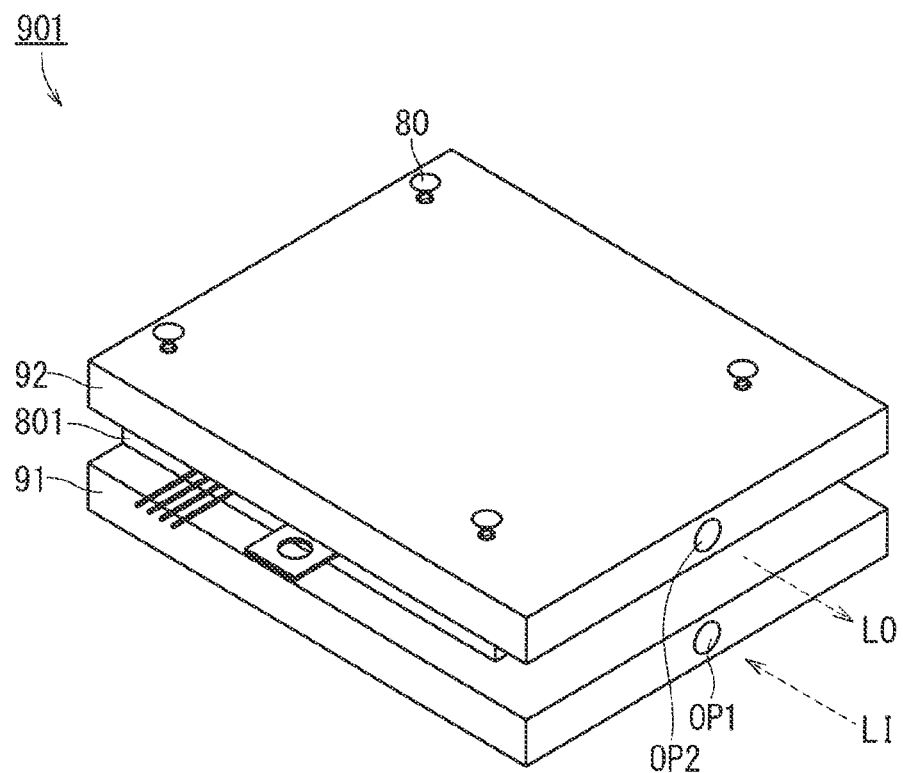
FIG. 2 is a perspective view schematically showing the configuration of the semiconductor device (water-cooled module unit) according to the first embodiment of the present invention.
Figure 3:
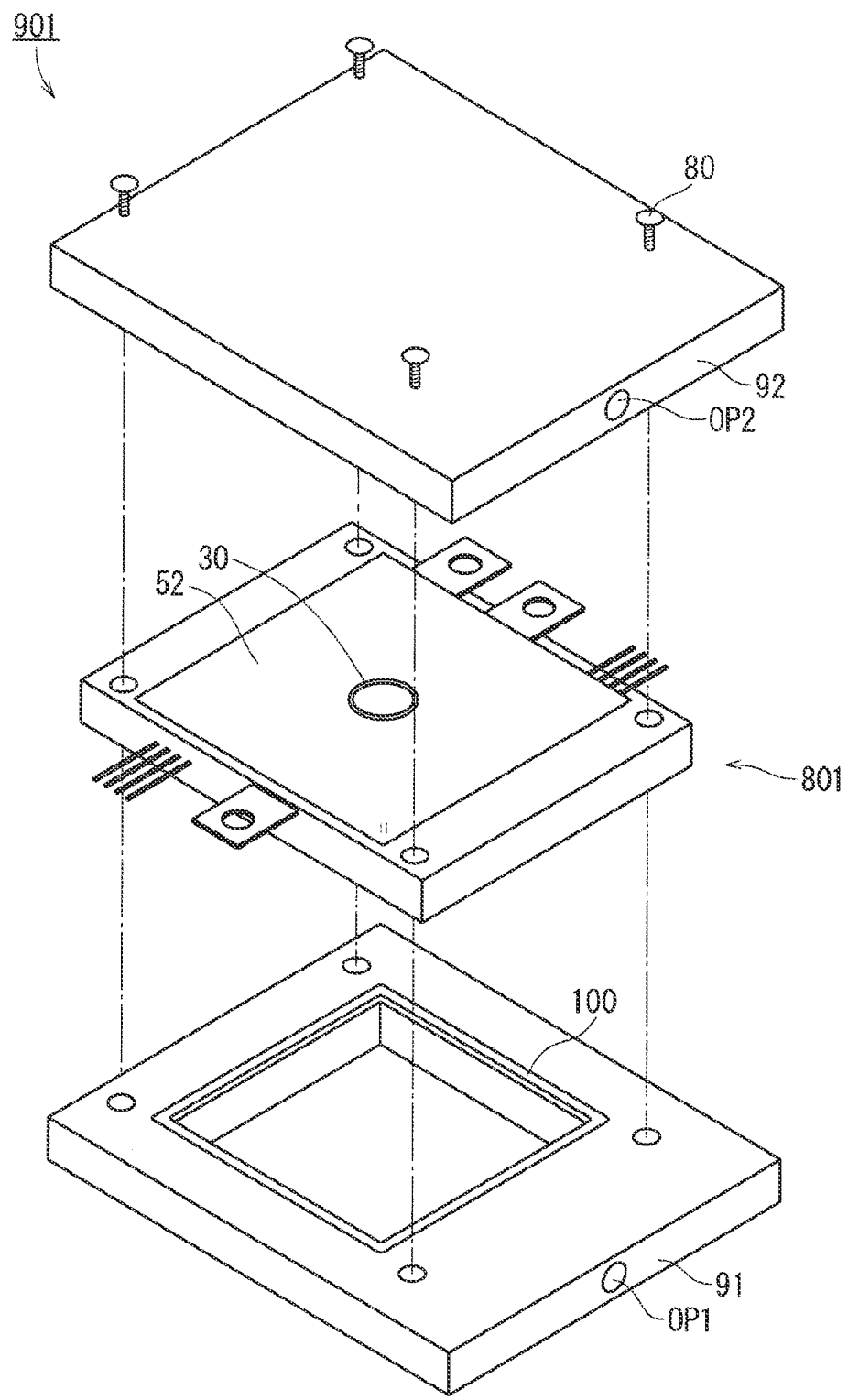
FIG. 3 is an exploded perspective view of FIG. 2.

FIG. 1 is a cross-sectional view schematically showing a configuration of a water-cooled module unit 901 (semiconductor device) according to a first embodiment. Note that FIG. 1 is drawn in a simplified manner, and does not include illustrations of members (such as a semiconductor element described below) sealed by a sealing member 70. FIG. 2 is a perspective view schematically showing a configuration of the water-cooled module unit 901. FIG. 3 is an exploded perspective view of FIG. 2. FIG. 4 is a perspective view not including an illustration of an upper part of FIG. 2.

The water-cooled module unit 901 includes a power module 801 (semiconductor device), a first water cooling jacket 91, a second water cooling jacket 92, bolts 80, and O-rings 100. The first water cooling jacket 91 and the second water cooling jacket are attached to a lower surface and an upper surface of the power module 801, respectively, by a plurality of the bolts 80. The O-rings 100 are disposed between the power module 801 and respective components of the first water cooling jacket 91 and the second water cooling jacket 92 to improve watertightness.

The power module 801 has a first heat sink 51, a second heat sink 52, a hollow tube 30 (first hollow tube), a sealing member 70, and a case 60. The case 60 has bolt holes 80T through which the bolts 80 are inserted. The bolts 80 press the second water cooling jacket 92 toward the first water cooling jacket 91. Note that a detailed structure of the power module 801 will be described below.

The first heat sink 51 has an inner surface FI1 (first inner surface), and an outer surface FO1 (first outer surface) opposite to the inner surface FI1. In addition, the first heat sink 51 has a through hole TH1 (first through hole) between the inner surface FI1 and the outer surface FO1. The second heat sink 52 has an inner surface FI2 (second inner surface), and an outer surface FO2 (second outer surface) opposite to the inner surface FI2. The inner surface FI2 is disposed with a clearance left from the inner surface FI1 of the first heat sink 51. The second heat sink 52 has a through hole TH2 (second through hole) between the inner surface FI2 and the outer surface FO2.

The hollow tube 30 is made of metal. The hollow tube 30 extends in a thickness direction to connect the through hole TH1 of the first heat sink 51 and the through hole TH2 of the second heat sink 52. In this manner, the first heat sink 51 and the second heat sink 52 are thermally tightly connected. The hollow tube 30 has a space SP0 that connects the through hole 1111 and the through hole TH2. The hollow tube 30 includes a portion having a tubular shape. In other words, the hollow tube 30 includes a portion having a collar shape.

The first water cooling jacket 91 has a space SP1 (first space) connected to the through hole TH1 of the first heat sink 51. The second water cooling jacket 92 has a space SP2 (second space) connected to the through hole TH2 of the second heat sink 52. The space SP1 and the space SP2 are connected with each other by the space SP0 in the hollow tube 30. The first water cooling jacket 91 has an opening OP1 for the space SP1.

The second water cooling jacket 92 has an opening OP2 for the space SP2. This configuration allows cooling water for cooling the power module 801 to be introduced into the space SP1 through the opening OP of the first water cooling jacket 91 (see arrow LI in FIG. 1), then introduced into the space SP2 via the space SP0 in the hollow tube 30, and then discharged from the opening OP2 of the second water cooling jacket 92 (see arrow LO in FIG. 1). During the flow of the cooling water from the space SP1 to the space SP2, the cooling water and the sealing member 70 are separated from each other by the hollow tube 30 made of metal. Therefore, entrance of moisture into the sealing member 70 is avoided.

(Details of Configuration)

Figure 5:
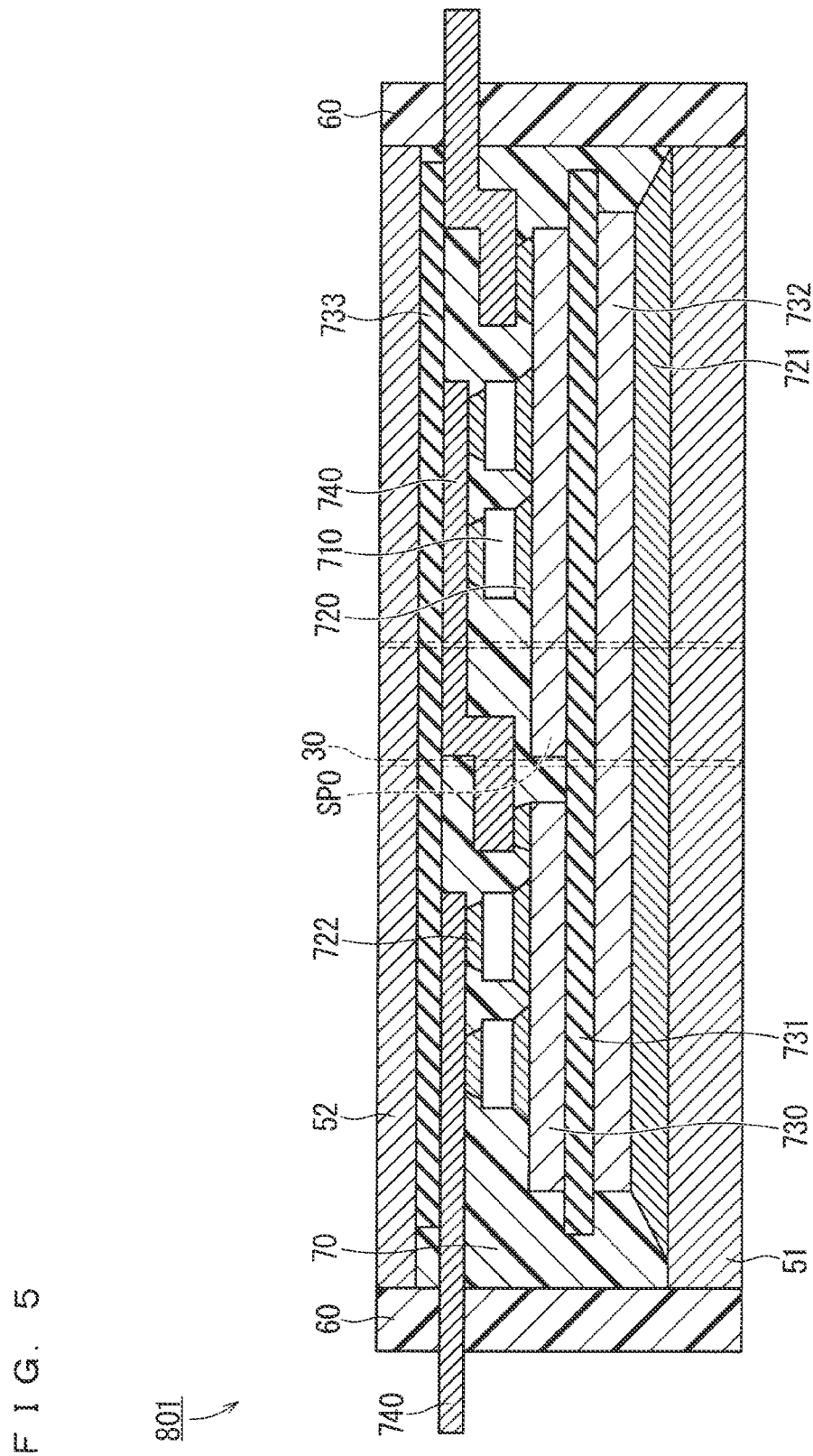
FIG. 5 is a cross-sectional view schematically showing a configuration of a semiconductor device (power module) according to the first embodiment of the present invention.
Figure 6:
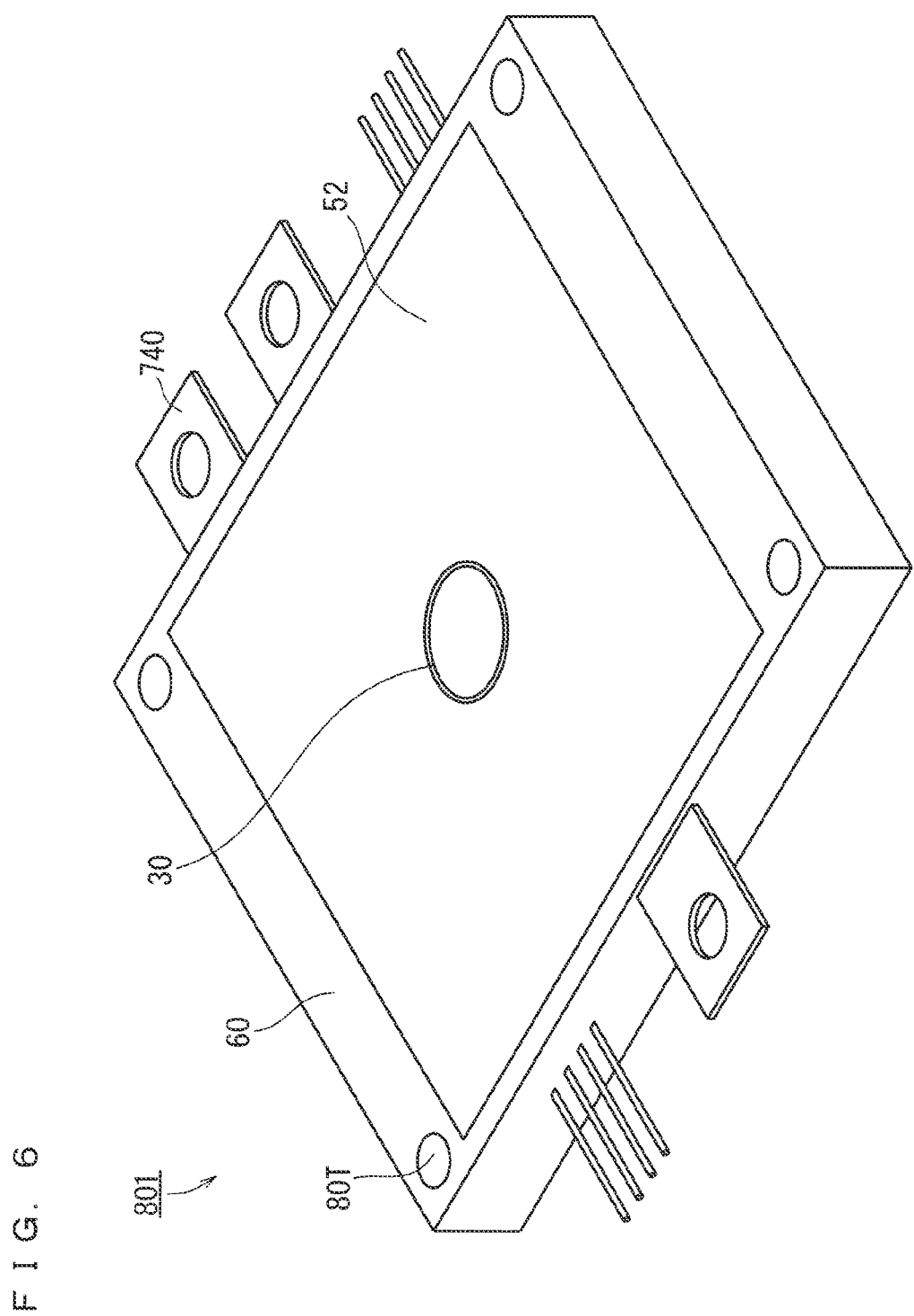
FIG. 6 is a perspective view schematically showing the configuration of the semiconductor device (power module) according to the first embodiment of the present invention.
Figure 7:
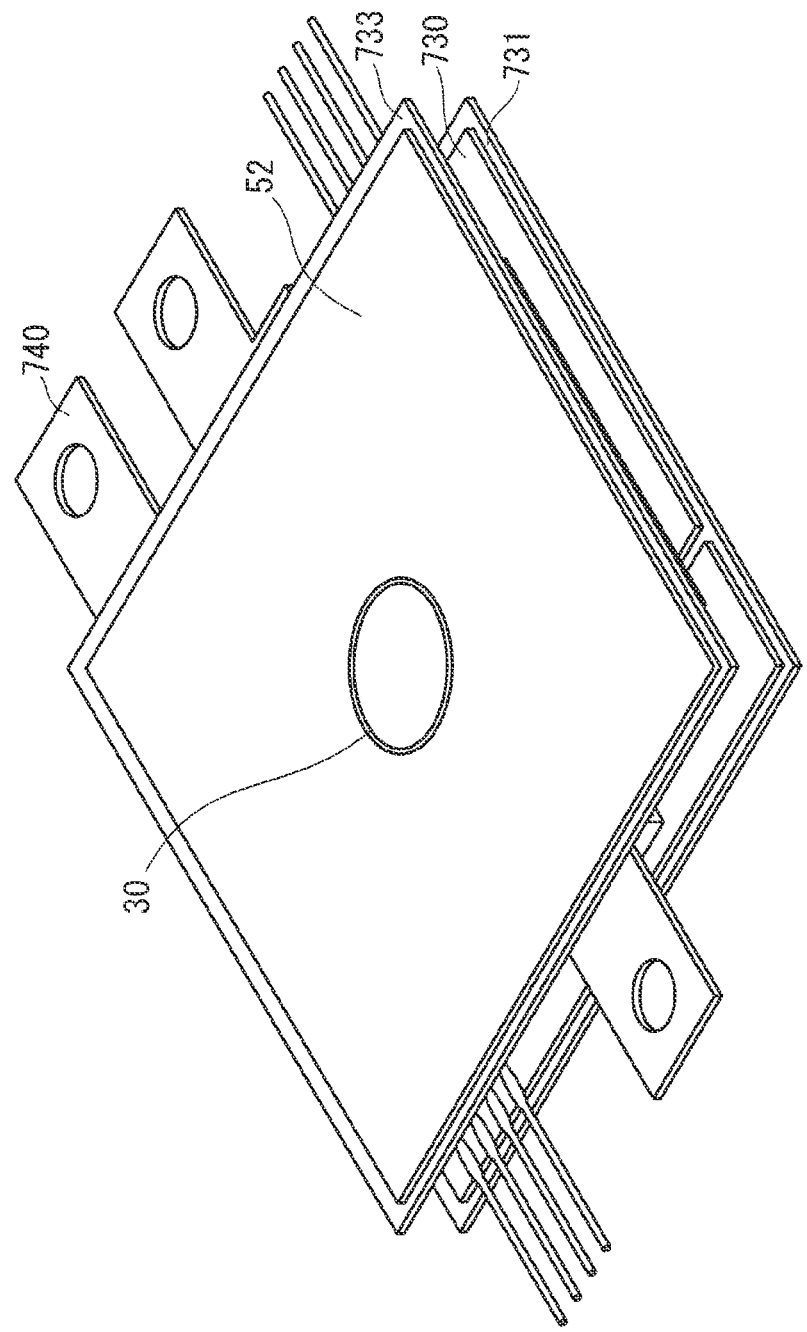
FIG. 7 is a perspective view not including an illustration of a partial configuration of FIG. 6.
Figure 8:
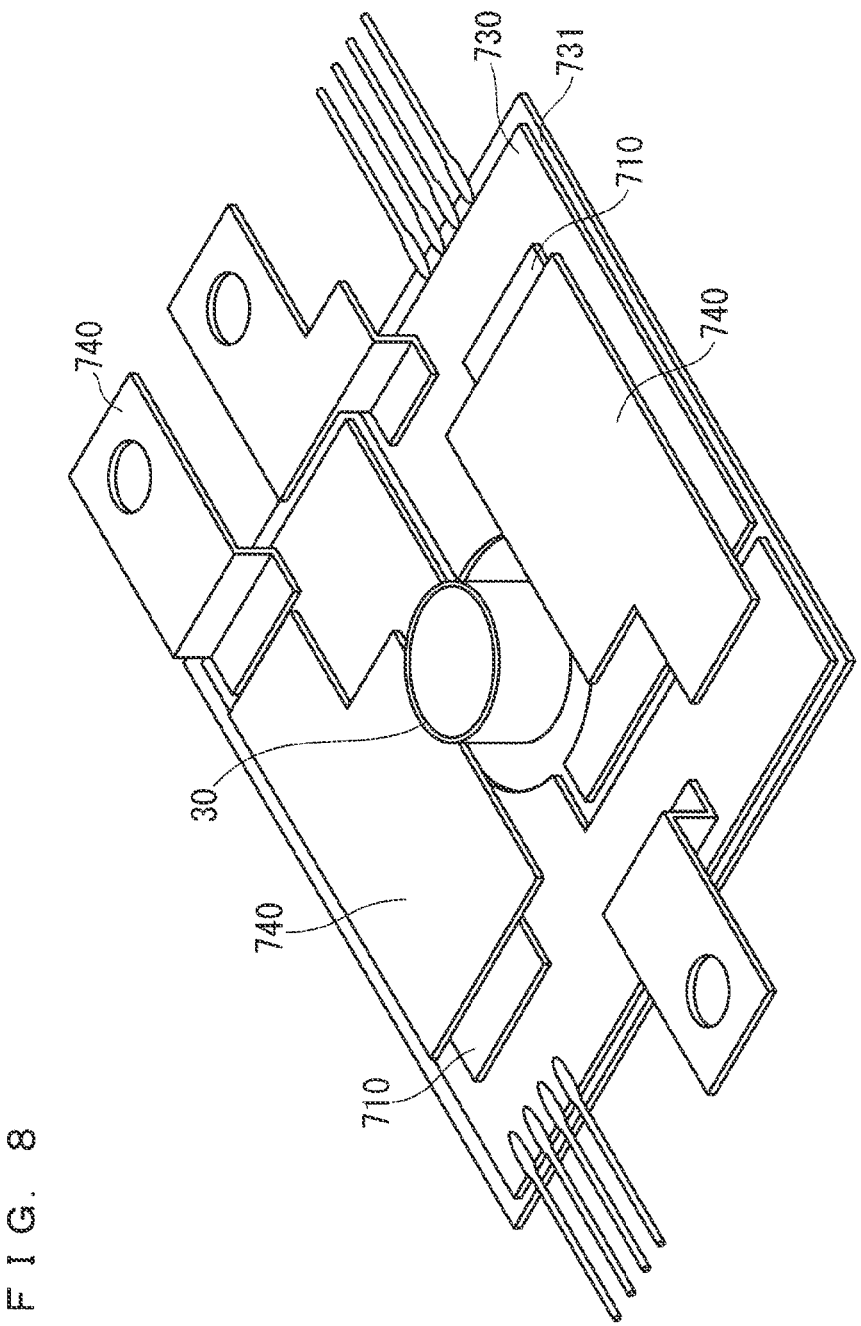
FIG. 8 is a perspective view not including an illustration of a partial configuration of FIG. 7.
Figure 9:
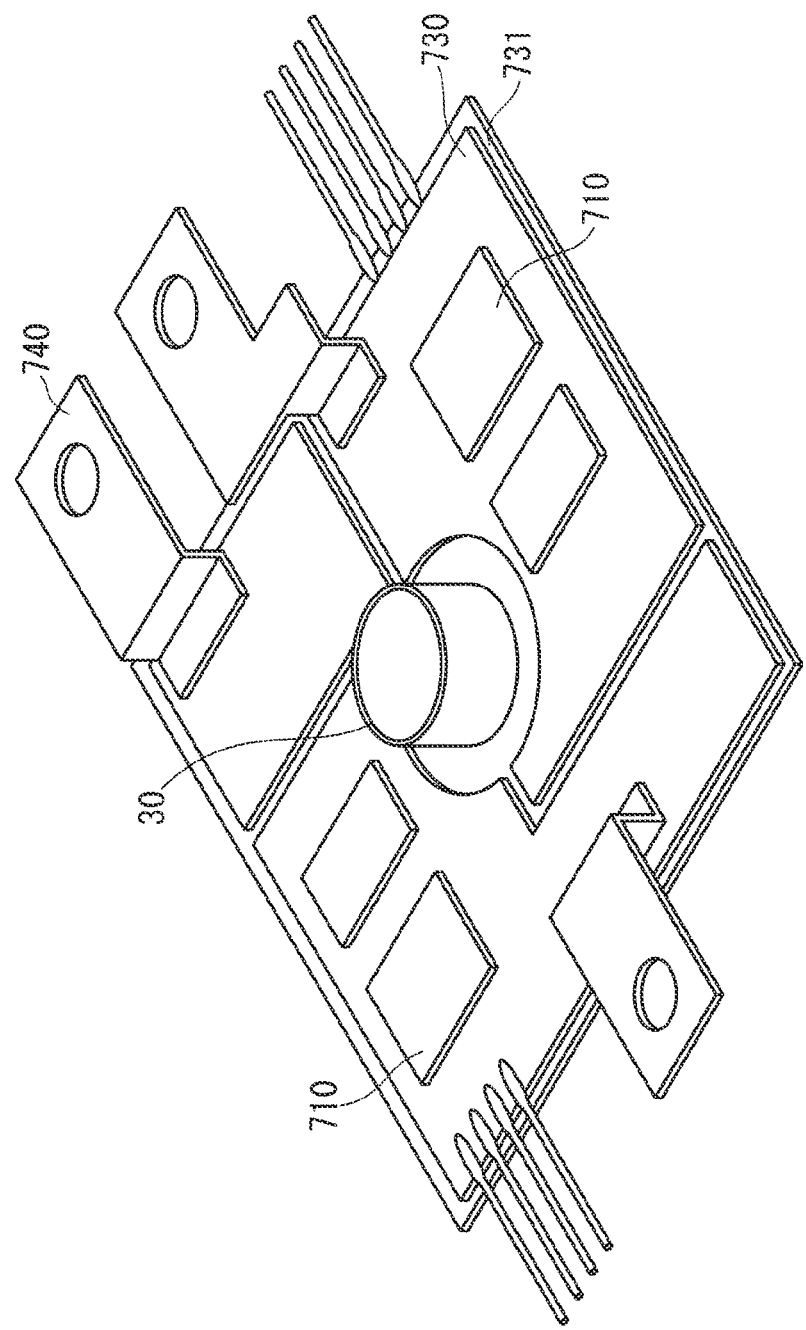
FIG. 9 is a perspective view not including an illustration of a partial configuration of FIG. 8.

FIGS. 5 and 6 are a cross-sectional view and a perspective view, respectively, schematically showing a configuration of the power module 801. FIG. 7 is a perspective view not including an illustration of a partial configuration of FIG. 6. FIG. 8 is a perspective view not including an illustration of a partial configuration of FIG. 7. FIG. 9 is a perspective view not including an illustration of a partial configuration of FIG. 8. The power module (semiconductor device) 801 includes a semiconductor element 710, the sealing member 70, the hollow tube 30, a first insulating plate 731, a second insulating plate 733, a plurality of electrodes 740, the case 60, a circuit pattern 730, and a conductor layer 732.

The hollow tube 30 and each of the first heat sink 51 and the second heat sink 52 are joined to each other by welding or press-fitting, for example. Note that the joining method is not limited to this method.

The hollow tube 30 has an elliptical shape in an in-plane direction, in other words, in a plan view. Note that a circle is a type of ellipse in the present description.

The sealing member 70 seals the semiconductor element 710 within a clearance between the inner surface FI1 of the first heat sink 51 and the inner surface FI2 of the second heat sink 52. The sealing member 70 is preferably in contact with a side surface of the hollow tube 30, and more preferably fills a space inside the case 60 and outside the hollow tube 30 with substantially no cavity. In a modification, the case 60 may be eliminated by forming a portion corresponding to the case 60 using the sealing member 70 as well.

The sealing member 70 is made of an insulator. The sealing member 70 is preferably made of resin, and more preferably made of molding resin (resin suitable for transfer molding technology). In other words, the power module 801 is preferably a transfer-molded power module. The mold resin is preferably epoxy resin. The sealing member 70 of the transfer molded power module is usually gel-free, in other words, composed of non-gel.

The first heat sink 51 and the second heat sink are exposed to the space SP1 and the space SP2, respectively. Therefore, the first heat sink 51 and the second heat sink are in contact with cooling water passing through the space SP1 and the space SP2. For preventing rust generated by this contact, these surfaces are preferably subjected to rust preventive treatment. Specifically, a plating layer for rust prevention may be provided. This plating layer is made of nickel, chrome, or tin, for example.

Each of the first heat sink 51 and the second heat sink 52 is preferably made of a high thermal conductive material (material having thermal conductivity of about 100 W/m·K or more). Specifically, each of the first heat sink 51 and the second heat sink 52 is preferably made of metal, and more preferably made of non-ferrous metal. Moreover, each of the first heat sink 51 and the second heat sink 52 is preferably made of a material having corrosion resistance. Examples of a material satisfying these conditions include metal such as Cu (copper), aluminum (Al), and Mo (molybdenum), and carbon.

The first heat sink 51 is disposed on a lower surface of the first insulating plate 731 via a brazing member 721 and the conductor layer 732. In other words, the first heat sink 51 is joined, via the brazing member 721, to the conductor layer 732 provided on the first insulating plate 731. In a modification, the brazing member 721 may be eliminated, and the first heat sink 51 and the conductor layer 732 may be directly joined to each other. For this purpose, solid phase diffusion junction or die casting is used, for example. Moreover, the conductor layer 732 may be further eliminated, and the first heat sink 51 and the first insulating plate 731 may be directly joined to each other.

The second heat sink 52 is disposed on an upper surface of the second insulating plate 733. The second insulating plate 733 may be provided for a purpose of reliably insulating the second heat sink 52 from the semiconductor element 710 or the electrode 740.

The first insulating plate 731 has a through hole that overlaps with the through hole TH1 in a planar layout. The second insulating plate 733 has a through hole that overlaps with the through hole TH2 in the planar layout. The first insulating plate 731 is disposed between the first heat sink 51 and the semiconductor element 710. The first insulating plate 731 may be made of ceramics, such as AlN (aluminum nitride).

Alternatively, the first insulating plate 731 may be made of resin. The first insulating plate 731 may be provided as an insulating substrate on which the semiconductor element 710 is mounted. Specifically, the semiconductor element 710 in FIG. 5 may be supported by the first insulating plate 731 as an insulating substrate via the brazing member 720 and the circuit pattern 730. The second insulating plate 733 is disposed between the second heat sink 52 and the semiconductor element 710. The second insulating plate 733 may be made of ceramics, such as AlN (aluminum nitride).

Alternatively, the second insulating plate 733 may be made of resin.

The circuit pattern 730 is made of a conductor, such as Al (aluminum) and Cu (copper). The circuit pattern 730 is joined to a lower surface of the semiconductor element 710 by the brazing member 720. The circuit pattern 730 also functions as a path to a different potential.

The conductor layer 732 is made of Al (aluminum) or Cu (copper), for example. An upper surface of the conductor layer 732 is joined to the first insulating plate 731. A lower surface of the conductor layer 732 is joined to the first heat sink 51 by the brazing member 721.

The semiconductor element 710 is disposed within the clearance between the inner surface FI1 of the first heat sink 51 and the inner surface FI2 of the second heat sink 52. The semiconductor element 710 is surrounded by the case 60 in the planar layout. The lower surface of the semiconductor element 710 is joined to the circuit pattern 730 by the brazing member 720. The number of the semiconductor elements 710 included in the power module 801 may be any number. The semiconductor element 710 is a power semiconductor element, such as an IGBT (Insulated Gate Bipolar Transistor), a MOSFET (Metal Oxide Semiconductor Field Effect Transistor), and a freewheeling diode. The semiconductor element 710 may have a portion made of silicon carbide (SiC). In other words, the semiconductor element 710 may be a silicon carbide semiconductor element.

When the power module 801 has a plurality of the semiconductor elements 710, the hollow tube 30 is preferably disposed between the plurality of semiconductor elements 710 in the planar layout as shown in FIG. 9.

Each of the plurality of electrodes 740 is made of a conductor, such as Al (aluminum) and Cu (copper). Each of the plurality of electrodes 740 may include an electrode insert-molded into the case 60. Moreover, each of the plurality of electrodes 740 may include an electrode joined to an upper surface of the circuit pattern 730 by the brazing member 720. Furthermore, each of the plurality of electrodes 740 may include an electrode functioning as a path to external wiring. In addition, each of the plurality of electrodes 740 may include an electrode joined to the upper surface of the semiconductor element 710 by the brazing member 722, that is, a DLB (Direct Lead Bond) electrode. A thickness of the DLB electrode may be determined in consideration of interference with other surrounding members (e.g., wire bond wiring, second insulating plate 733, and second heat sink 52). In addition, at least one of the first heat sink 51, the second heat sink 52, the first insulating plate 731, and the second insulating plate 733 may come into contact with a part of the plurality of electrodes 740 for improving heat radiation, height adjustment, or others.

The first heat sink 51 and the second heat sink 52 may have common dimensions. The first insulating plate 731 and the second insulating plate 733 may have common dimensions.

The water-cooled module unit 901 has one power module 801. However, the water-cooled module unit 901 in a modification may have a plurality of the power modules 801 disposed in parallel with each other.

In manufacture of the water-cooled module unit 901, the first water cooling jacket 91 may be attached to the power module 801 to which the O-ring 100 has been attached beforehand, or the power module 801 may be attached to the first water cooling jacket 91 to which the O-ring 100 has been attached beforehand. Similarly, the second water cooling jacket 92 may be attached to the power module 801 to which the O-ring 100 has been attached beforehand, or the power module 801 may be attached to the second water cooling jacket 92 to which the O-ring 100 has been attached beforehand.

(Summary of Effects)

According to the present embodiment (see FIG. 1), the first heat sink 51 and the second heat sink 52, which are thermally tightly connected to each other by the hollow tube 30 made of metal, are cooled by cooling water. Accordingly, high cooling performance is achievable. Specifically, high cooling performance can be achieved by an effect that the hollow tube 30 diffuses heat between the first heat sink 51 and the second heat sink 52, and an effect that the hollow tube 30 itself radiates heat. Therefore, the power module 801 with high output is allowed to be operated. Moreover, the hollow tube 30 is used as a cooling water path. Accordingly, the cooling water path between the first heat sink 51 and the second heat sink 52 is allowed to be disposed in the water-cooled module unit 901 without occupying a large space. Therefore, the power module 801 can be miniaturized. Furthermore, the hollow tube 30 is made of metal. Accordingly, entrance of the cooling water into the sealing member 70 by permeation into the hollow tube 30 is prevented. Therefore, reliability deterioration caused by absorption of the cooling water by the sealing member 70 is avoidable. As apparent from the above, miniaturization of the power module 801 with high output is achievable while securing high reliability.

Particularly in a case where the sealing member 70 is made of epoxy resin, reliability might be deteriorated by permeation of water into the epoxy resin if the hollow tube 30 were not provided. According to the present embodiment, this deterioration can be effectively prevented.

If the cooling water path constituted by the hollow tube 30 were not provided, a water cooling jacket which has a cooling water path extending from the first space SP1 to the second space SP2 and disposed outside the power module 801 would need to be provided. In this case, a complicated design considering a flow of the cooling water would be necessary. Therefore, the water cooling jacket would require a complicated structure (for example, a structure having a fin shape). According to the present embodiment, such a complicated structure is not required, and the first water cooling jacket 91 and the second water cooling jacket 92 having a relatively simple shape are allowed to be used. Therefore, the water cooling jacket can be miniaturized.

When the first insulating plate 731 (FIG. 5) is made of ceramics, rigidity of the first insulating plate 731 increases in comparison with a case where the first insulating plate 731 is made of resin. Accordingly, deformation of the power module 801 caused by heat is reduced. Therefore, reliability of the power module 801 further improves.

The same applies to the second insulating plate 733.

When the first insulating plate 731 (FIG. 5) is made of resin, cracks generated in the first insulating plate 731 around the through hole TH1 can be reduced in comparison with the case where the first insulating plate 731 is made of ceramics. Therefore, reliability of the power module 801 further improves. The same applies to the second insulating plate 733.

Each of the through hole TH1 of the first heat sink 51 and the through hole TH2 of the second heat sink 52 has an elliptical shape in correspondence with the hollow tube 30 having an elliptical shape. In this case, each of the through hole TH1 and the through hole TH2 does not have a sharp angle. Accordingly, cracks generated around the through hole TH1 and the through hole 1112 can be reduced. Therefore, reliability of the power module 801 further improves.

The semiconductor element 710 may be a silicon carbide semiconductor element. In this case, the power module 801 can be further miniaturized.

When the first heat sink 51 and the second heat sink 52 are made of Cu, thermal conductivity particularly increases. When the first heat sink 51 and the second heat sink 52 are made of Al, weight reduction is achievable. When the first heat sink 51 and the second heat sink 52 are made of Mo, reliability further improves by reduction of thermal deformation. Note that the first heat sink 51 and the second heat sink 52 may be made of either the same material or different materials.

Second Embodiment

Figure 10:
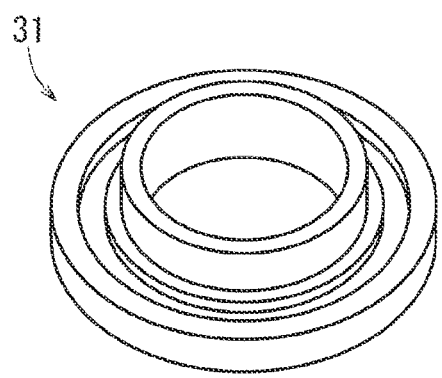
FIG. 10 is a perspective view schematically showing a hollow tube according to a second embodiment of the present invention.
Figure 11:
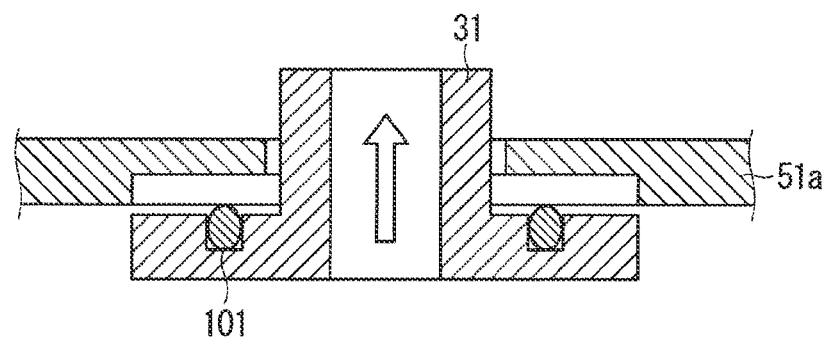
FIG. 11 is a cross-sectional view schematically explaining a method of attaching the hollow tube shown in FIG. 10.

FIG. 10 is a perspective view schematically showing a hollow tube 31 according to a second embodiment. FIG. 11 is a cross-sectional view schematically explaining a method of attaching the hollow tube 31 to a first heat sink 51*a*.

In the second embodiment, the hollow tube 31 and the first heat sink 51*a* are used in place of the hollow tube 30 and the first heat sink 51 (FIG. 1: first embodiment), respectively. As shown in FIG. 11, the hollow tube 31 and the first heat sink 51*a* are joined to each other using a brazing member 101. For example, this junction is made by crushing the brazing member 101 between a flange portion included in the hollow tube 31 and a thickness-reduced portion of the first heat sink 51*a*. The flange portion may have a groove in which the brazing member 101 is disposed. In a modification, a groove may be formed in the first heat sink Sla. In addition, an O-ring may be used instead of the brazing member 101. For further improving watertightness, an outer circumference of the flange portion of the hollow tube 31 and the first heat sink Sla may be welded or pressure-fitted to each other.

Note that configurations other than the above are substantially the same as the corresponding configurations of the first embodiment described above. Accordingly, the same or corresponding elements are designated by the same reference numerals, and description thereof will not be repeated.

Third Embodiment

Figure 12:
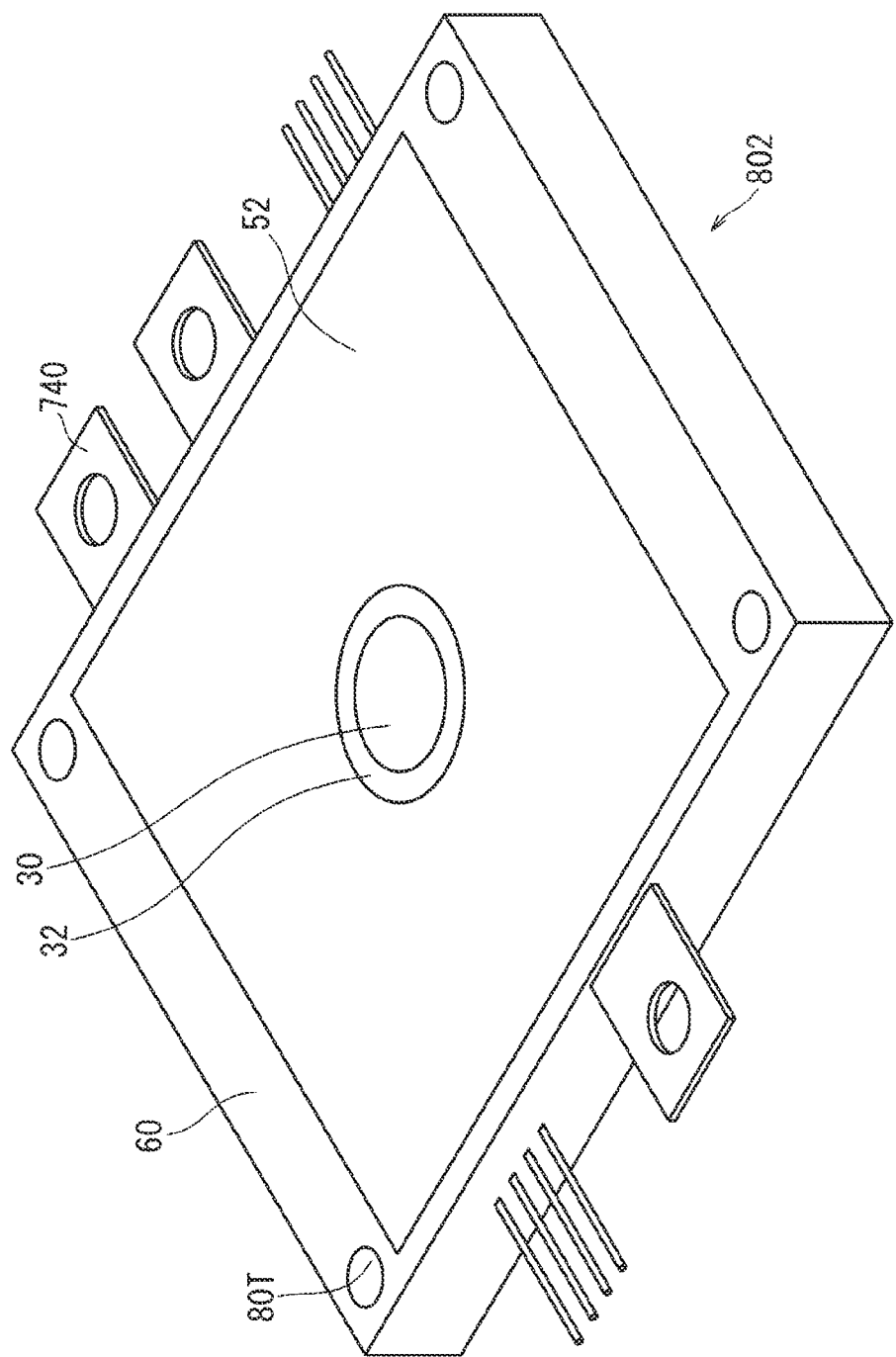
FIG. 12 is a perspective view schematically showing a configuration of a semiconductor device (power module) according to a third embodiment of the present invention.
Figure 13:
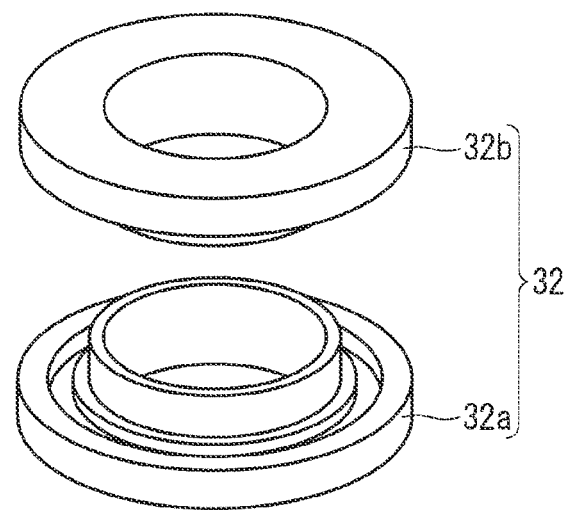
FIG. 13 is a perspective view schematically showing a hollow tube included in the semiconductor device in FIG. 12.
Figure 14:
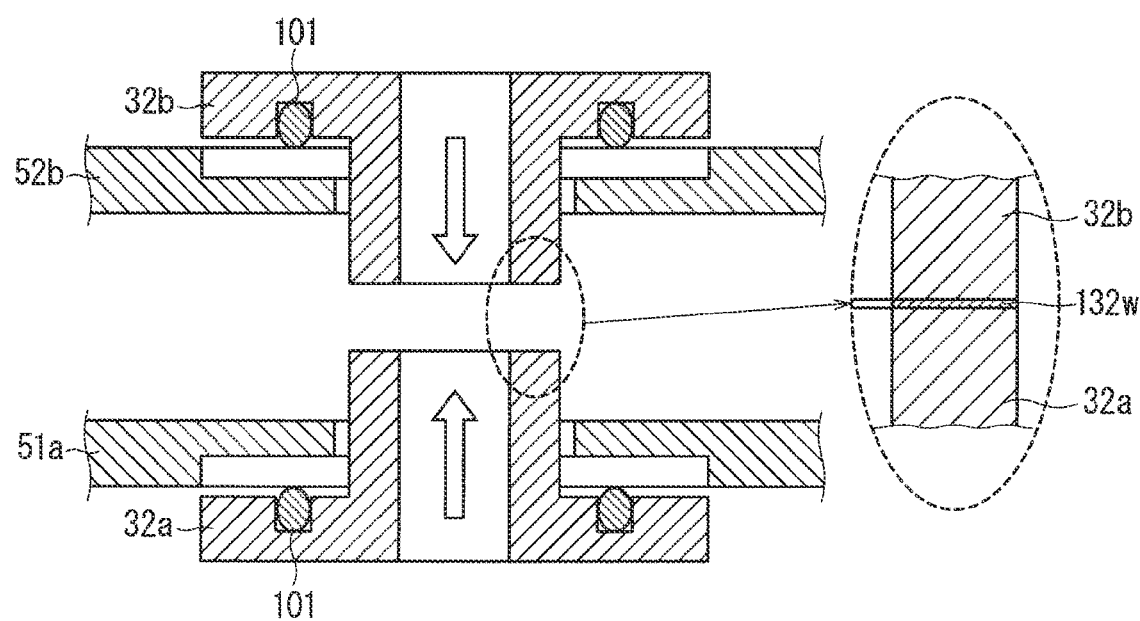
FIG. 14 is a cross-sectional view schematically explaining a method of attaching the hollow tube shown in FIG. 13.

FIG. 12 is a perspective view schematically showing a configuration of a power module 802 (semiconductor device) according to a third embodiment. FIG. 13 is a perspective view schematically showing a hollow tube 32 included in the power module 802. FIG. 14 is a cross-sectional view schematically explaining a method of attaching the hollow tube 32.

In the third embodiment, the hollow tube 32, the first heat sink 51*a*, and a second heat sink 52*a* are used in place of the hollow tube 30, the first heat sink 51, and the second heat sink 52 (FIG. 1: first embodiment), respectively. The first heat sink Sla is similar to the first heat sink 51*a* of the second embodiment. The difference between the second heat sink 52 and the second heat sink 52*a* is substantially similar to the difference between the first heat sink 51 and the first heat sink Sla. The hollow tube 32 is formed by welding portions 32*a* and 32*b* substantially vertically symmetrical to each other. In other words, the portions 32*a* and 32*b* are joined to each other by a welding layer 132*w*. Note that the method of joining the portion 32*a* and the first heat sink Sla may be similar to the corresponding method of the second embodiment. The method of joining the portion 32*b* and the second heat sink 52*a* may be similarly achieved as above.

Figure 15:
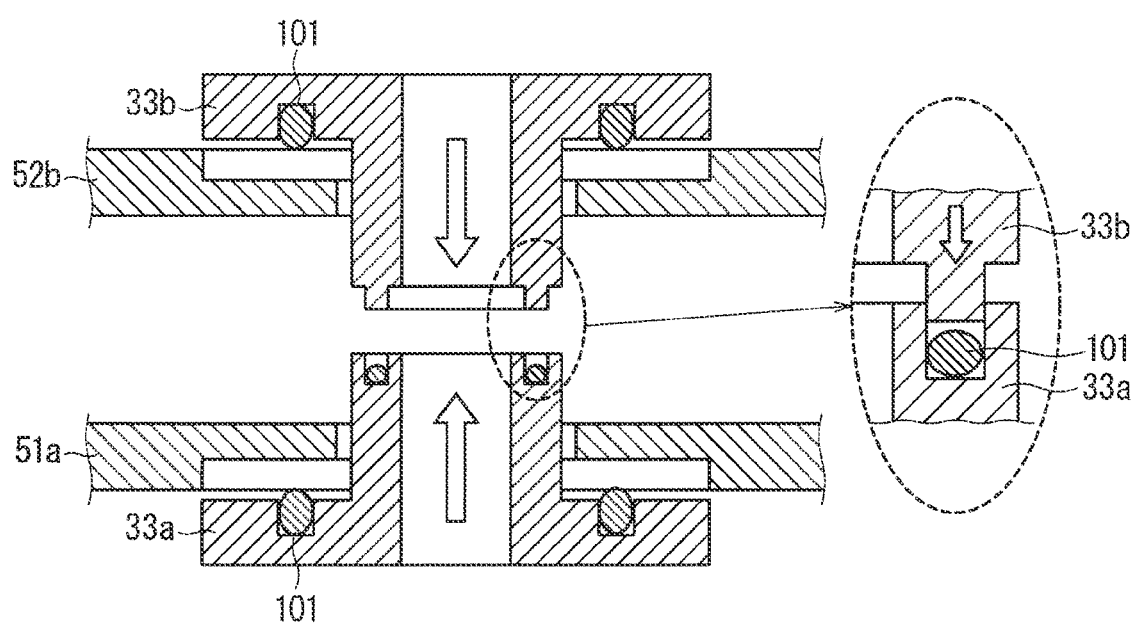
FIG. 15 is a cross-sectional view schematically explaining a method of attaching a hollow tube in a modification of the third embodiment of the present invention.

FIG. 15 is a cross-sectional view schematically explaining a method of attaching a hollow tube in a modification. In the present modification, portions 33*a* and 33*b* are used in place of the portions 32*a* and 32*b* (FIG. 14), respectively. The brazing member 101 between the portion 33*a* and the portion 33*b* are crushed to join the portion 33*a* and the portion 33*b* to each other while securing watertightness. A recess and a protrusion for fitting the portion 33*a* and the portion 33*b* to each other are formed at locations where the portion 33*a* and the portion 33*b* face each other. The brazing member 101 is disposed in this recess. Note that an O-ring may be used instead of the brazing member 101.

Fourth Embodiment

Figure 16:
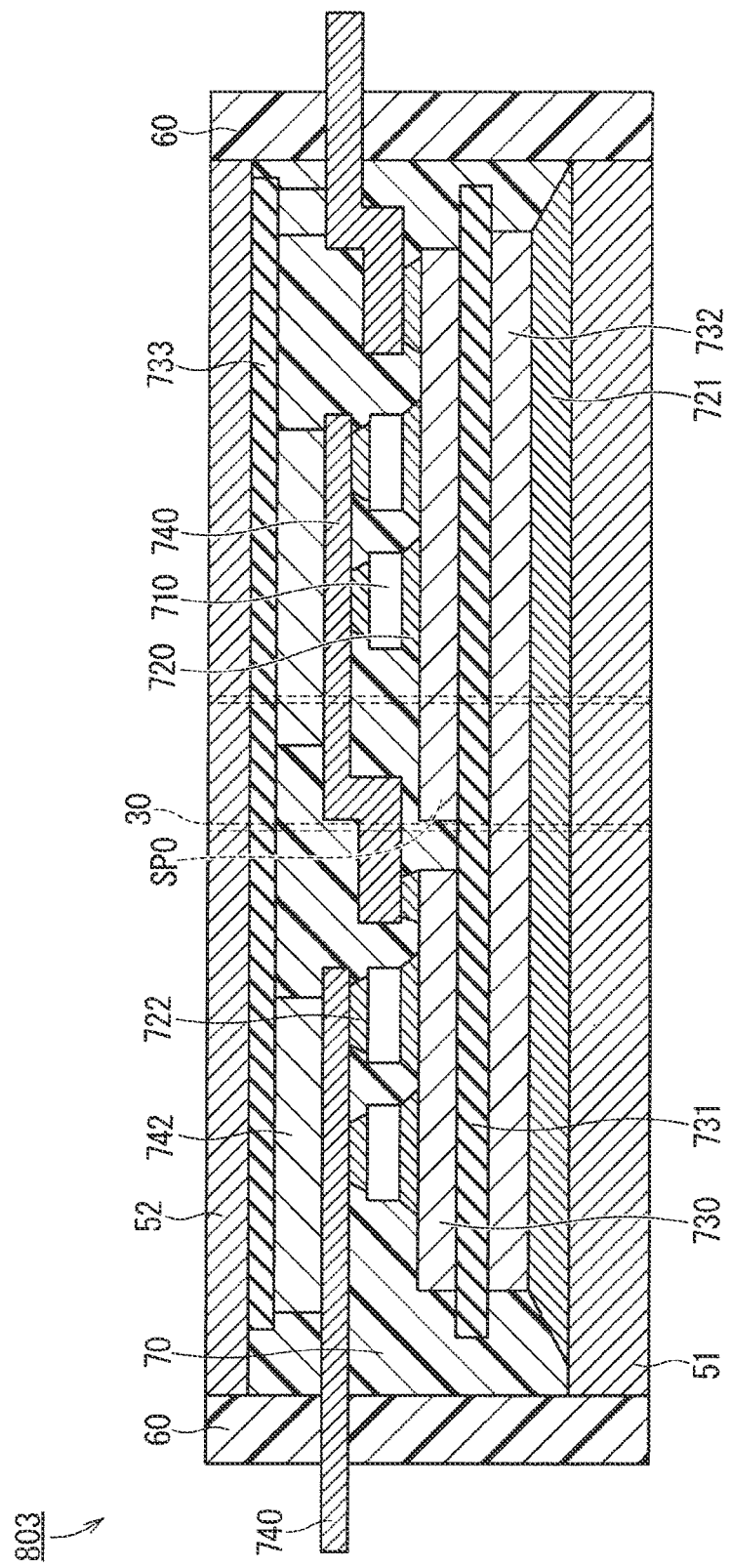
FIG. 16 is a cross-sectional view schematically showing a configuration of a semiconductor device (power module) according to a fourth embodiment of the present invention.

FIG. 16 is a cross-sectional view schematically showing a configuration of a power module 803 (semiconductor device) according to a fourth embodiment. The power module 803 has a Cu block 742 (metal block) on an electrode 740 for height adjustment. In this manner, the second insulating plate 733 is disposed on the electrode 740 via the Cu block 742. Note that configurations other than this configuration are substantially the same as the corresponding configurations of the first to third embodiments described above. Accordingly, the same or corresponding elements are designated by the same reference numerals, and description thereof will not be repeated.

Fifth Embodiment

Figure 17:
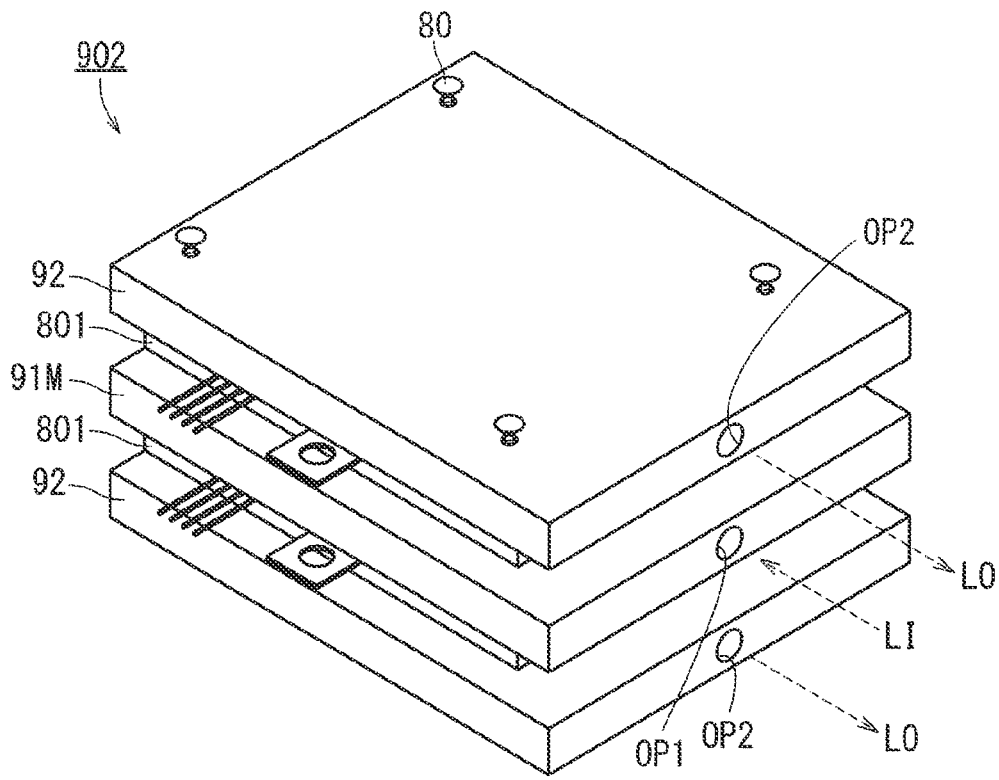
FIG. 17 is a perspective view schematically showing a configuration of a semiconductor device (water-cooled module unit) according to a fifth embodiment of the present invention.

FIG. 17 is a perspective view schematically showing a configuration of a water-cooled module unit 902 (semiconductor device) according to a fifth embodiment. The water-cooled module unit 902 in the figure includes a first water cooling jacket 91M, the power modules 801 attached to an upper surface and a lower surface of the first water cooling jacket 91M, and the second water cooling jackets 92 attached to the respective power modules 801. A unit constituted by the power module 801 and the second water cooling jacket 92 on an upper surface of the first water cooling jacket 91M, and a unit of the power module 801 and the second water cooling jacket 92 on a lower surface of the first water cooling jacket 91M may have vertically symmetrical structures. The first water cooling jacket 91 (FIG. 1: first embodiment) has the space SP1 connected to the through hole TH1 of the power module 801 disposed on the upper surface. However, the first water cooling jacket 91M (FIG. 16) has a space connected to the through holes TH1 (not shown in FIG. 16) of the power modules 801 disposed on the upper surface and the lower surface. This space has the opening OP1. For example, cooling water is introduced from the opening OP1 and discharged from each of the openings OP2. Note that the flow of cooling water may be reversed.

Figure 18:
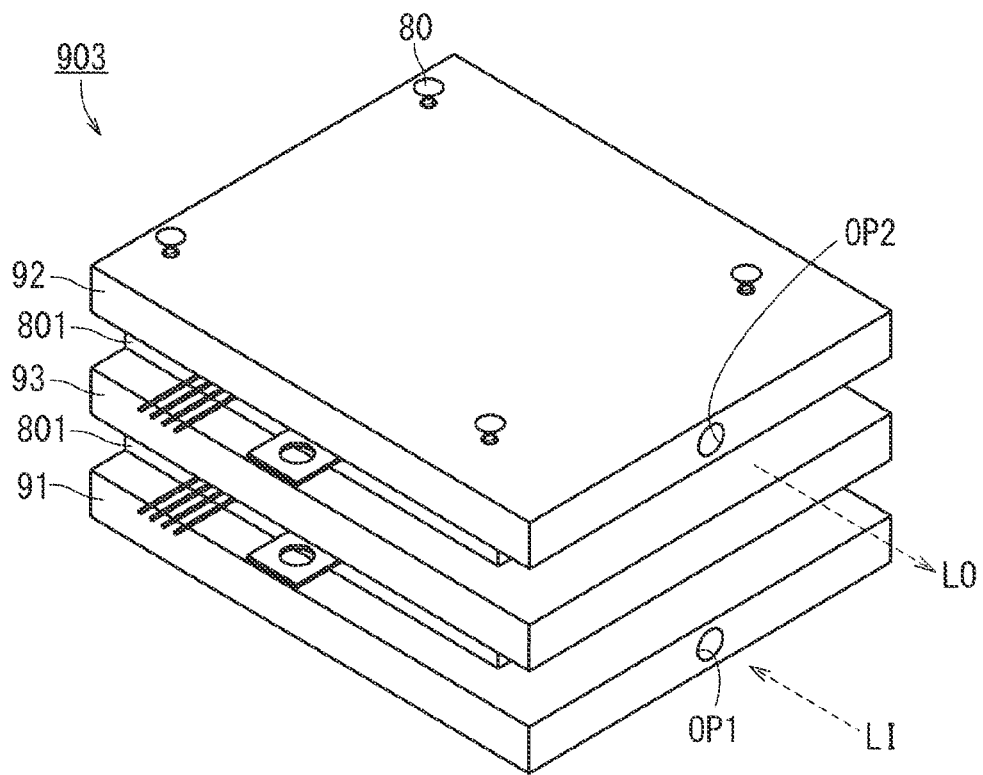
FIG. 18 is a perspective view showing a modification of FIG. 17.

FIG. 18 is a perspective view showing a water-cooled module unit 903 (semiconductor device) in a modification. In the present modification, a third water cooling jacket 93 and the power module 801 additionally provided are disposed between the power module 801 and the second water cooling jacket in the water-cooled module unit 901 (FIG. 2: first embodiment). The power module 801 additionally provided is located between the second water cooling jacket 92 and the third water cooling jacket 93. The third water cooling jacket 93 has a space for connecting the through hole TH2 (see FIG. 1) of the power module attached to a lower surface of the third water cooling jacket 93, and the through hole TH1 (see FIG. 1) of the power module attached to an upper surface of the third water cooling jacket 93.

According to the present embodiment or the modification thereof, such a structure which includes a plurality of the power modules 801 stacked in a thickness direction can be obtained. Note that the power module 802 (third embodiment) or the power module 803 (fourth embodiment) may be used instead of the power module 801 (first or second embodiment).

Sixth Embodiment

Figure 19:
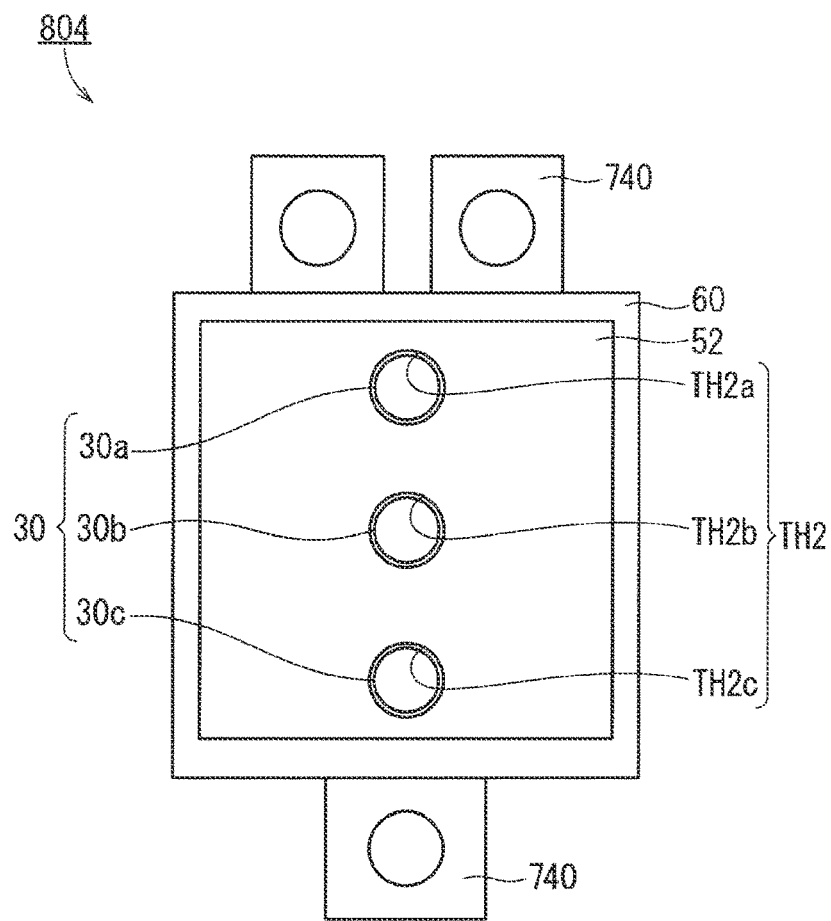
FIG. 19 is a plan view schematically showing a configuration of a semiconductor device (power module) according to a sixth embodiment of the present invention.

FIG. 19 is a plan view schematically showing a configuration of a power module 804 (semiconductor device) according to a sixth embodiment. In the power module 801 (FIG. 1: first embodiment), each of the first heat sink 51 and the second heat sink 52 has the one through hole TH1 (first through hole) and the one through hole TH2 (second through hole). However, in the power module 804, each of the first heat sink 51 and the second heat sink 52 has a plurality of the through holes TH1 and a plurality of the through holes TH2 (specifically, through holes TH2a to TH2c in FIG. 19). In other words, in the power module 804, the first heat sink 51 (FIG. 1) has at least one through hole (third through hole) additionally provided between the inner surface FI1 and the outer surface FO1 in addition to the through hole TH1 (FIG. 1: first embodiment), while the second heat sink 52 has at least one through hole (fourth through hole) additionally provided between the inner surface FI2 and the outer surface FO2.

Moreover, while the one hollow tube 30 made of metal is provided in the power module 801 (FIG. 1), a plurality of the hollow tubes 30 made of metal are provided in the power module 804 (specifically, hollow tubes 30a to 30c in FIG. 19). In other words, the power module 804 has a hollow tube additionally provided (at least one second hollow tube) in addition to the hollow tube 30 (FIG. 1: first embodiment). This hollow tube additionally provided connects the above-described through hole (third through hole) additionally provided in the first heat sink 51, and the above-described through hole (fourth through hole) additionally provided in the second heat sink 52.

Note that configurations other than the above are substantially the same as the configurations of the power modules 801 to 803 described above. Accordingly, the same or corresponding elements are designated by the same reference numerals, and description thereof will not be repeated.

According to the present embodiment, a hollow tube 30b (second hollow tube) is further provided in addition to the hollow tube 30a (first hollow tube). In this case, heat is radiated to cooling water from the hollow tube 30b as well as from the hollow tube 30a, and pressure losses of the cooling water are reduced. Therefore, the power module 803 with higher output is allowed to be operated. While the three hollow tubes 30a to 30c are provided as the plurality of hollow tubes 30 in FIG. 19, the number of the plurality of hollow tubes 30 may be two or any number larger than two.

Seventh Embodiment

Figure 20:
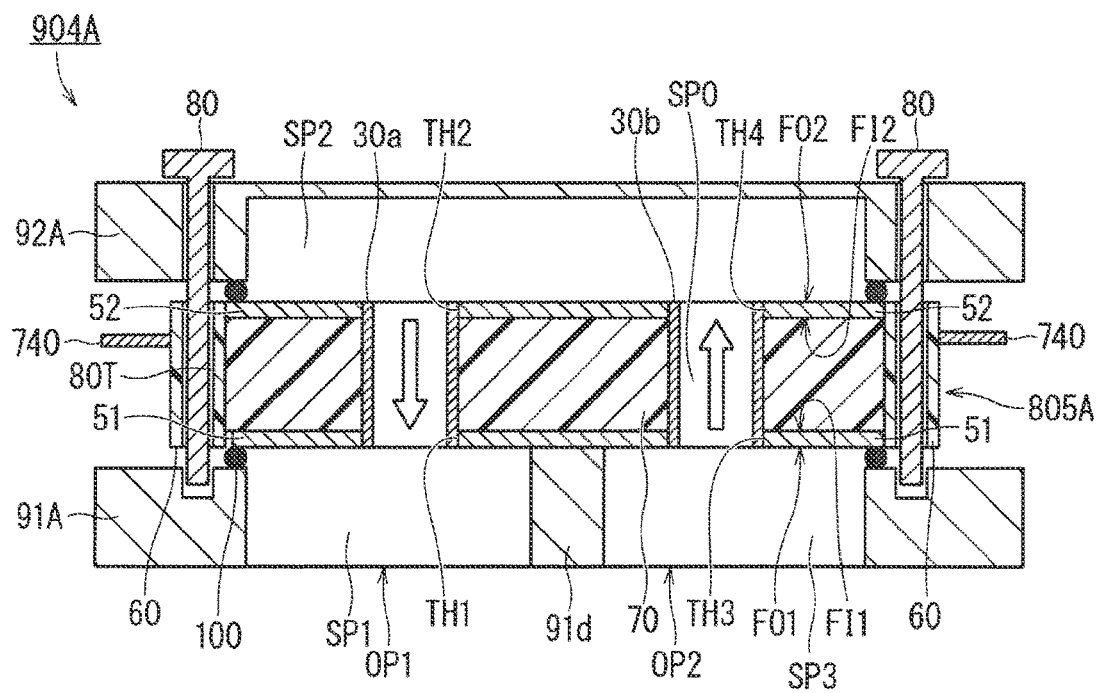
FIG. 20 is a cross-sectional view schematically showing a configuration of a semiconductor device (water-cooled module unit) according to a seventh embodiment of the present invention.

FIG. 20 is a cross-sectional view schematically showing a configuration of a water-cooled module unit 904A (semiconductor device) according to a seventh embodiment. The water-cooled module unit 904A includes a power module 805A, a first water cooling jacket 91A, and a second water cooling jacket 92A. In the power module 805A, the first heat sink 51 has a through hole TH3 (third through hole) between the inner surface FI1 and the outer surface FO1, while the second heat sink 52 has a through hole TH4 (fourth through hole) between the inner surface FI2 and the outer surface FO2. Moreover, the power module 805A has the hollow tube 30b which is made of metal and connects the through hole TH3 and the through hole TH4. The first water cooling jacket 91A has the space SP1 (first space) connected to the through hole TH1 of the first heat sink 51, and a space SP3 (second space) connected to the through hole TH3 of the first heat sink 51, and separates the space SP1 from the space SP3. The second water cooling jacket 92A has the space SP2 (second space) connected to the through hole TH2 and the through hole TH4 of the second heat sink 52. The space SP1 and the space SP3 have the opening OP1 and the opening OP2, respectively.

Note that configurations other than the above are substantially the same as the configurations of the water-cooled module unit 901 (FIG. 1: first embodiment) described above. Accordingly, the same or corresponding elements are designated by the same reference numerals, and description thereof will not be repeated.

According to the present embodiment, the first water cooling jacket 91A separates the space SP1 connected to the through hole TH1 of the first heat sink 51 from the space SP3 connected to the through hole TH3 of the first heat sink 51. In this manner, a flow direction of cooling water can be regulated in the first water cooling jacket 91A. Accordingly, the layout of the cooling water path can be easily optimized in accordance with an environment where the water-cooled module unit 904A is attached. Therefore, the degree of freedom in designing the flow path of the cooling water improves, and handleability for a user of the water-cooled module unit 904A improves.

(First Modification)

Figure 21:
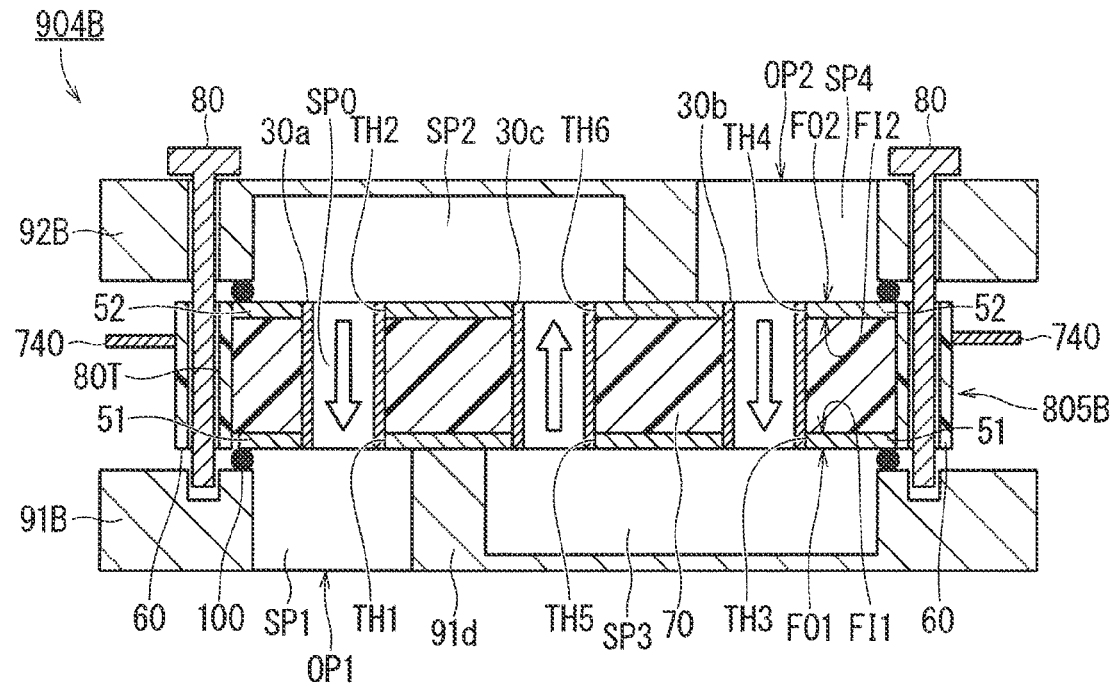
FIG. 21 is a cross-sectional view showing a first modification of FIG. 20.

FIG. 21 is a cross-sectional view showing a water-cooled module unit 904B (semiconductor device) in a first modification. The water-cooled module unit 904B includes a power module 805B, a first water cooling jacket 91B, and a second water cooling jacket 92B. In the power module 805B, the first heat sink 51 has the through hole TH3 (third through hole) and a through hole TH5 between the inner surface FI1 and the outer surface FO1, while the second heat sink 52 has the through hole TH4 (fourth through hole) and a through hole TH6 between the inner surface FI2 and the outer surface FO2. Moreover, the power module 805B has the hollow tube 30b which is made of metal and connects the through hole TH3 and the through hole TH4, and a hollow tube 30c which is made of metal and connects the through hole TH5 and the through hole TH6.

The first water cooling jacket 91B has the space SP1 (first space) connected to the through hole TH1 of the first heat sink 51, and the space SP3 (third space) connected to the through hole TH3 and the through hole TH5 of the first heat sink 51, and separates the space SP1 from the space SP3. The second water cooling jacket 92B has the space SP2 (second space) connected to the through hole TH2 and the through hole TH6 of the second heat sink 52, and a space SP4 (fourth space) connected to the through hole TH4 of the second heat sink 52, and separates the space SP2 from the space SP4. The space SP1 and the space SP4 have the opening OP1 and the opening OP2, respectively.

According to the present modification, the second water cooling jacket 92B separates the space SP2 connected to the through hole TH2 of the second heat sink 52 from the space SP4 connected to the through hole TH4 of the second heat sink 52. In this manner, a flow direction of cooling water can be regulated not only in the first water cooling jacket 91B but also in the second cooling jacket 92B. Accordingly, the layout of the cooling water path can be easily optimized in accordance with an environment where the water-cooled module unit 904B is attached. Therefore, the degree of freedom in designing the flow path of the cooling water improves, and handleability for a user of the water-cooled module unit 904A improves.

(Second Modification)

Figure 22:
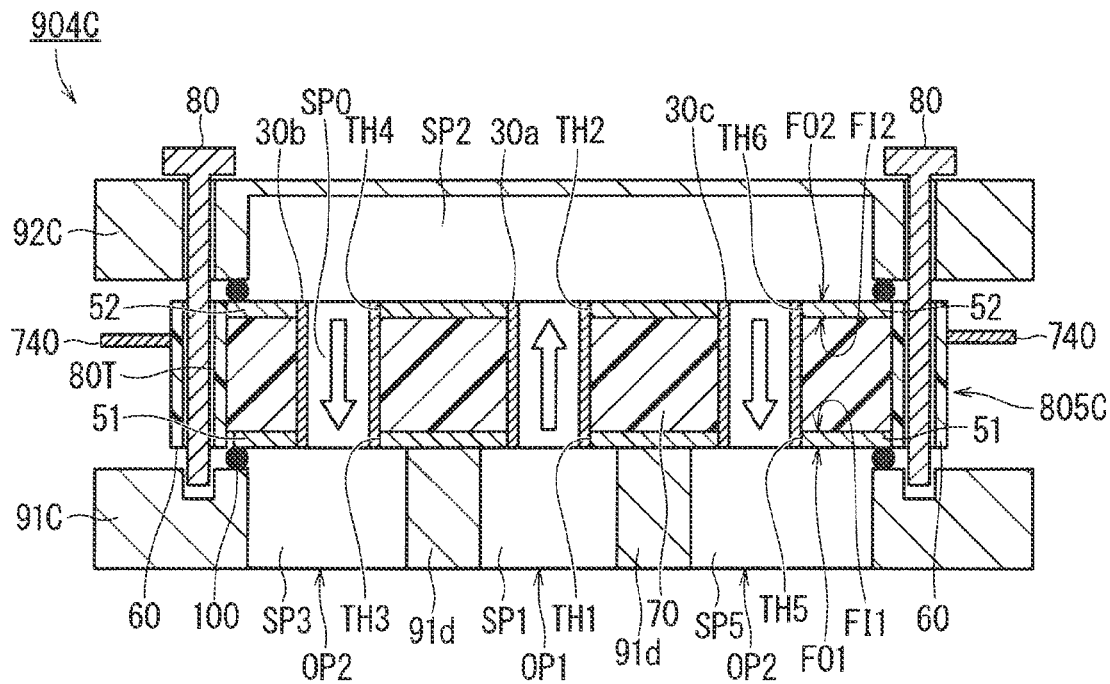
FIG. 22 is a cross-sectional view showing a second modification of FIG. 20.

FIG. 22 is a cross-sectional view showing a water-cooled module unit 904C (semiconductor device) in a second modification. The water-cooled module unit 904C includes a power module 805C, a first water cooling jacket 91C, and a second water cooling jacket 92C. In the power module 805C, the first heat sink 51 has the through hole TH3 (third through hole) and the through hole TH5 between the inner surface FI1 and the outer surface FO1, while the second heat sink 52 has the through hole TH4 (fourth through hole) and the through hole TH6 between the inner surface FI2 and the outer surface FO2. Moreover, the power module 805C has the hollow tube 30b which is made of metal and connects the through hole TH3 and the through hole TH4, and the hollow tube 30c which is made of metal and connects the through hole TH5 and the through hole TH6.

The first water cooling jacket 91C has the space SP1 (first space) connected to the through hole TH1 of the first heat sink 51, the space SP3 (third space) connected to the through hole TH3 of the first heat sink 51, and a space SP5 connected to the through hole TH5 of the first heat sink 51. The first water cooling jacket 91C separates the space SP1 from each of the space SP3 and the space SP5. Moreover, the first water cooling jacket 91C may separate the space SP3 from the space SP5. The second water cooling jacket 92C has the space SP2 (second space) connected to the through hole TH2, the through hole TH4, and the through hole TH6 of the second heat sink 52. The space SP1 has the opening OP1. Each of the space SP3 and the space SP5 has the opening OP2.

Eighth Embodiment

Figure 23:
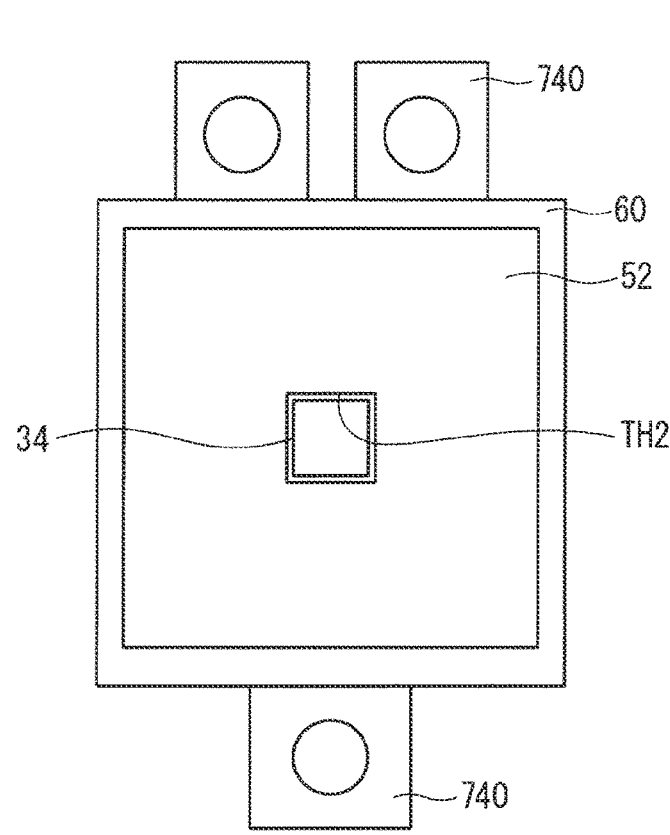
FIG. 23 is a plan view schematically showing a configuration of a semiconductor device (power module) according to an eighth embodiment of the present invention.

FIG. 23 is a plan view schematically showing a configuration of a power module 806 (semiconductor device) according to an eighth embodiment. The power module 806 has a hollow tube 34 (first hollow tube). The hollow tube 34 has a polygonal shape in an in-plane direction (in other words, in the plan view shown in FIG. 23). For example, the polygonal shape is a quadrangular, triangular, or trapezoidal shape. Note that configurations other than the above are substantially the same as the configurations of the power module 801 (FIG. 6: first embodiment). Accordingly, the same or corresponding elements are designated by the same reference numerals, and description thereof will not be repeated.

The hollow tube 34 has a polygonal shape, and therefore each of the through hole TH1 of the first heat sink 51 (not shown in FIG. 23) and the through hole TH2 of the second heat sink 52 also has a polygonal shape. In this case, each of the through hole TH1 and the through hole TH2 has a straight side. Accordingly, the semiconductor element 710 (see FIG. 9) can be efficiently disposed along these sides. Therefore, further miniaturization of the power module is achievable. In addition, even when the above disposition is not particularly required, the degree of freedom in designing improves in comparison with a case where the shape of the hollow tube is limited to an elliptical shape.

Ninth Embodiment

Figure 24:
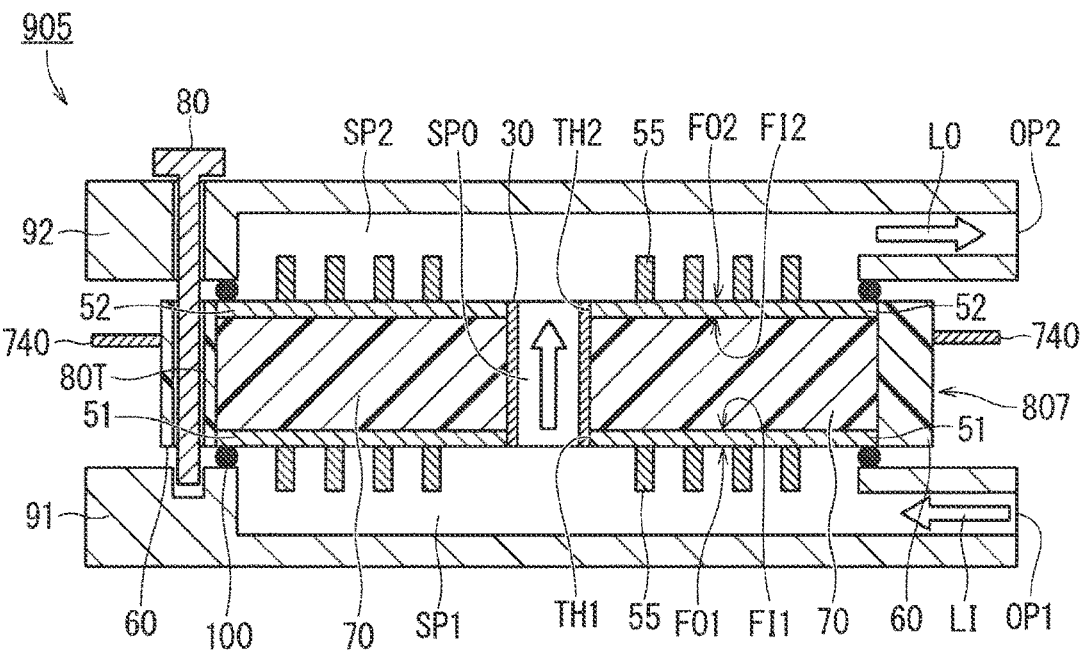
FIG. 24 is a cross-sectional view schematically showing a configuration of a semiconductor device (water-cooled module unit) according to a ninth embodiment of the present invention.

FIG. 24 is a cross-sectional view schematically showing a configuration of a water-cooled module unit 905 (semiconductor device) according to a ninth embodiment.

The water-cooled module unit 905 has a power module 807 (semiconductor device). The power module 807 has a fin structure 55 on the first heat sink 51 and the second heat sink 52. For example, the fin structure is pin-shaped, wavy, or columnar. In a modification, the fin structure 55 may be provided on only either the first heat sink 51 or the second heat sink 52. Note that configurations other than the above are substantially the same as the configurations of the water-cooled module unit 901 (FIG. 1: first embodiment) described above. Accordingly, the same or corresponding elements are designated by the same reference numerals, and description thereof will not be repeated. According to the present embodiment, a contact area with the cooling water increases by providing the fin structure. Therefore, cooling performance further improves.

Tenth Embodiment

Figure 25:
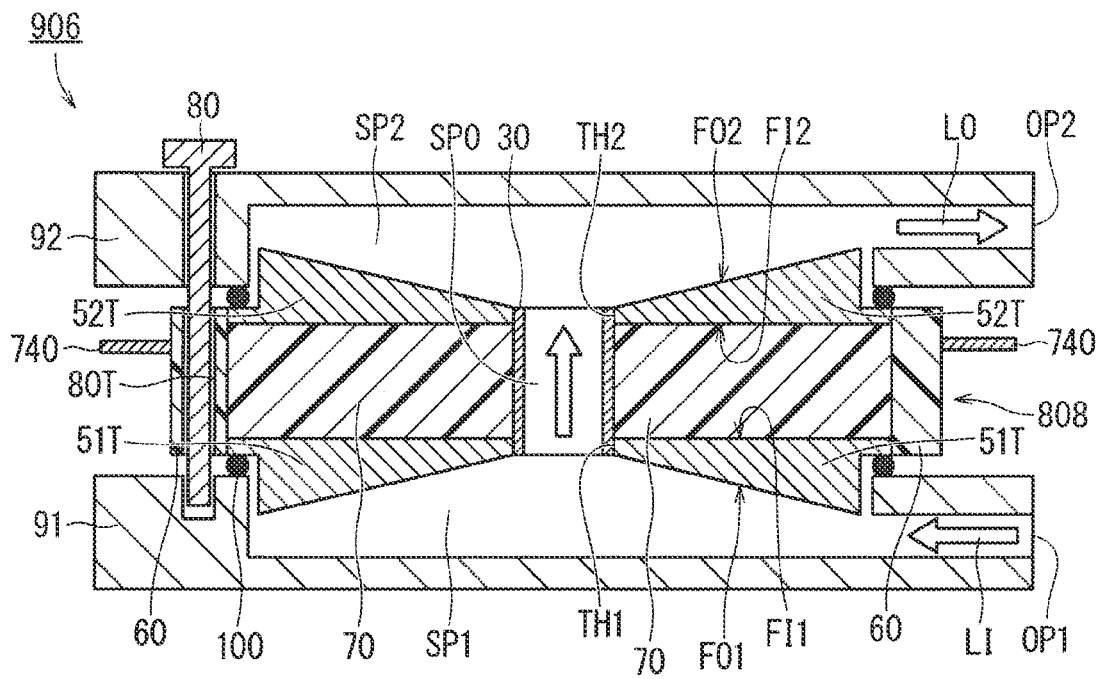
FIG. 25 is a cross-sectional view schematically showing a configuration of a semiconductor device (water-cooled module unit) according to a tenth embodiment of the present invention.

FIG. 25 is a cross-sectional view schematically showing a configuration of a water-cooled module unit 906 (semiconductor device) according to a tenth embodiment.

The water-cooled module unit 906 has a power module 808 (semiconductor device). The power module 808 has a first heat sink 51T and a second heat sink 52T. The outer surface FO1 of the first heat sink ST forms the space SP1 having a shape tapered toward the through hole TH1. The outer surface FO2 of the second heat sink 52T forms the space SP2 having a shape tapered toward the through hole TH2. Note that configurations other than the above are substantially the same as the configurations of the water-cooled module unit 901 (FIG. 1: first embodiment) described above. Accordingly, the same or corresponding elements are designated by the same reference numerals, and description thereof will not be repeated.

Figure 26:
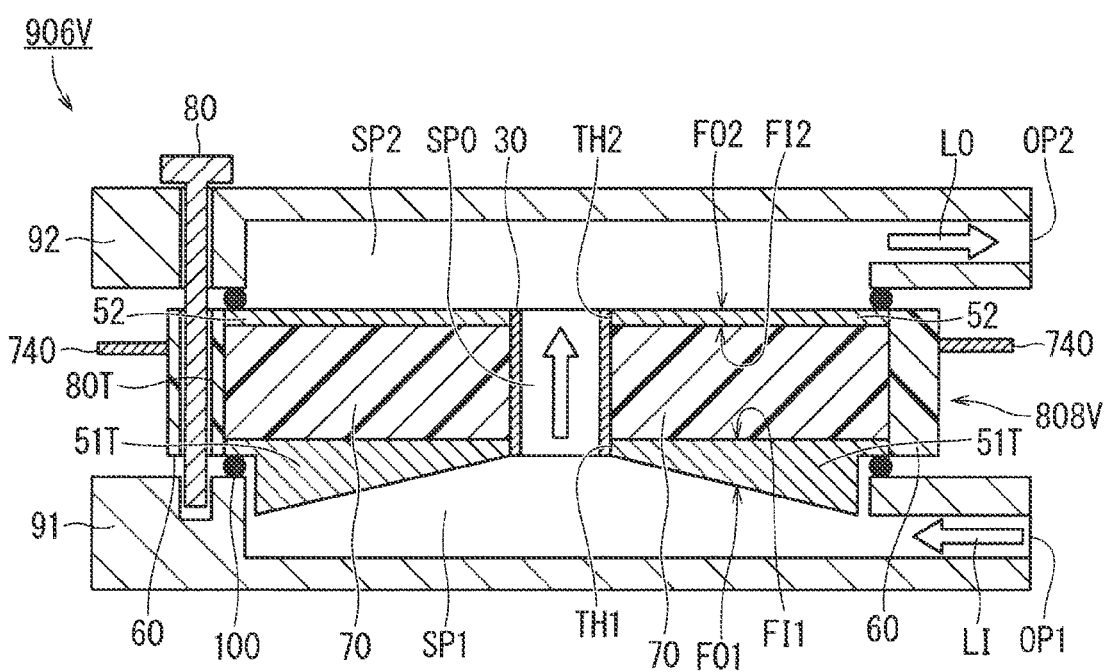
FIG. 26 is a cross-sectional view showing a modification of FIG. 25.

FIG. 26 is a cross-sectional view schematically showing a configuration of a water-cooled module unit 906V (semiconductor device) in a modification. In the present modification, the water-cooled module unit 906 includes the second heat sink 52 having the outer surface FO2 which is flat, similarly to the first embodiment. Other points are similar to the corresponding points of the water-cooled module unit 906 (FIG. 25).

According to the present embodiment or the modification thereof, the outer surface FO1 of the first heat sink 51T forms a space having a shape tapered toward the through hole TH1. Accordingly, heat radiation from the first heat sink 51T is promoted, and pressure losses of cooling water are reduced. Therefore, the power module 808 with higher output is allowed to be operated.

Eleventh Embodiment

Figure 27:
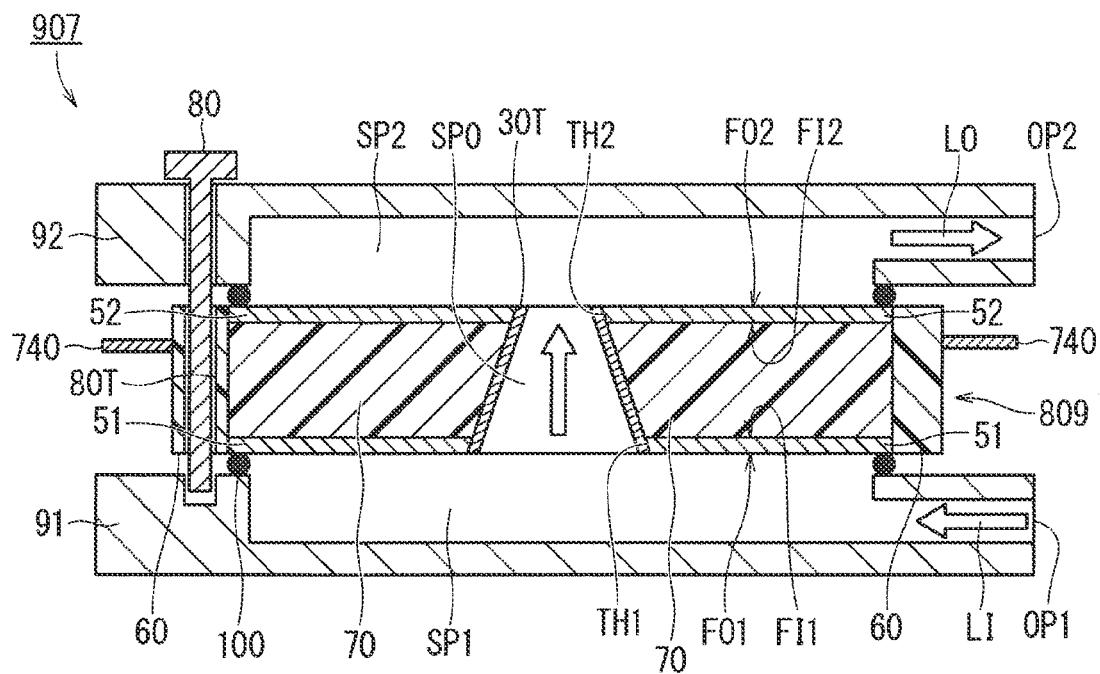
FIG. 27 is a cross-sectional view schematically showing a configuration of a semiconductor device (water-cooled module unit) according to an eleventh embodiment of the present invention.

FIG. 27 is a cross-sectional view schematically showing a configuration of a water-cooled module unit 907 (semiconductor device) according to an eleventh embodiment. The water-cooled module unit 907 has a power module 809 (semiconductor device). The power module 809 has a hollow tube 30T (first hollow tube). The hollow tube 30T has a tapered internal space. Note that configurations other than the above are substantially the same as the configurations of the water-cooled module unit 901 (FIG. 1: first embodiment) described above. Accordingly, the same or corresponding elements are designated by the same reference numerals, and description thereof will not be repeated. According to the present embodiment, the hollow tube 301 has a tapered internal space. Accordingly, heat radiation from the hollow tube 30T is promoted, and pressure losses of cooling water are reduced. Therefore, the power module 809 with higher output is allowed to be operated.

Twelfth Embodiment

Figure 28:
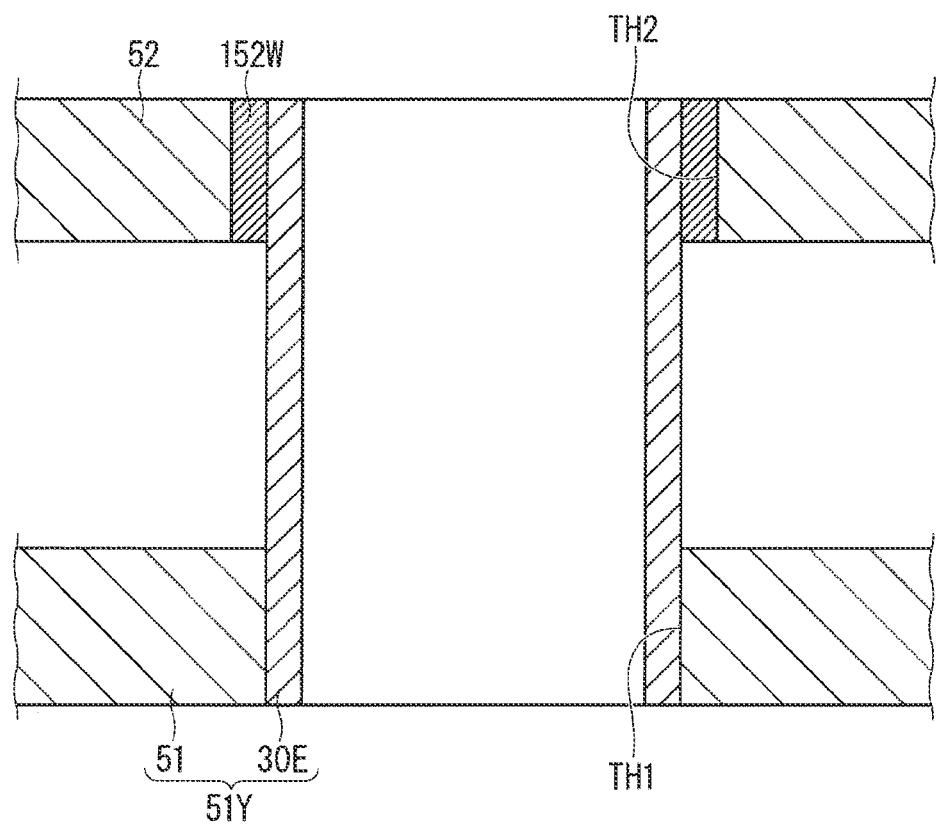
FIG. 28 is a cross-sectional view schematically showing a hollow tube and first and second heat sinks in a twelfth embodiment of the present invention.

FIG. 28 is a cross-sectional view schematically showing a hollow tube 30E (first hollow tube), the first heat sink 51, and the second heat sink 52 according to a twelfth embodiment. The hollow tube 30F and the first heat sink 51 are continuously connected to each other by a uniform material. In other words, the hollow tube 30E and the first heat sink 51 are integrated. The hollow tube 30E and the second heat sink 52 may be joined by a welding layer 152W, for example. Note that configurations other than the above are substantially the same as the configurations of the water-cooled module unit 901 (FIG. 1: first embodiment) described above. Accordingly, description of these configurations will not be repeated. According to the present embodiment, a member for connecting the hollow tube 30E and the first heat sink 51 (for example, a brazing member (FIG. 11: second embodiment)) can be eliminated. Therefore, reduction of the number of parts is achievable while maintaining performance.

Figure 29:
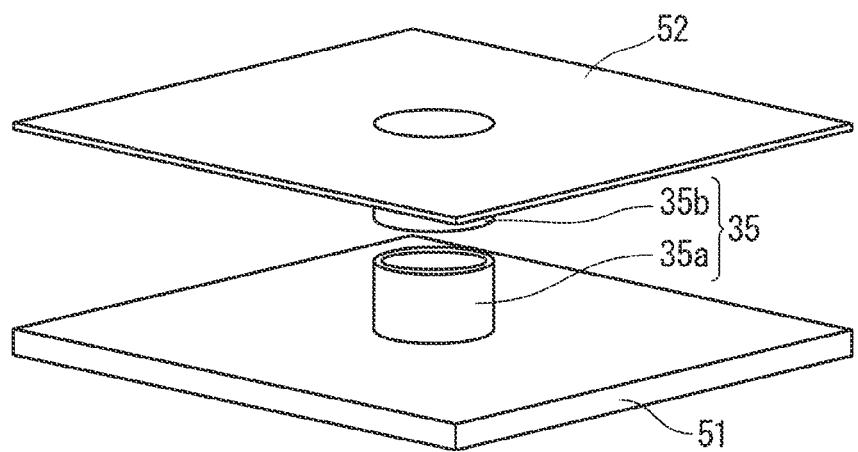
FIG. 29 is a perspective view explaining configurations of a hollow tube and first and second heat sinks in a first modification of the twelfth embodiment of the present invention.

FIG. 29 is a perspective view explaining configurations of a hollow tube 35 (first hollow tube), the first heat sink 51, and the second heat sink 52 in a first modification. The hollow tube 35 has a portion 35a and a portion 35b. The portion 35a and the first heat sink 51 are continuously connected by a uniform material. The portion 35b and the second heat sink 52 are continuously connected by a uniform material.

Figure 30:
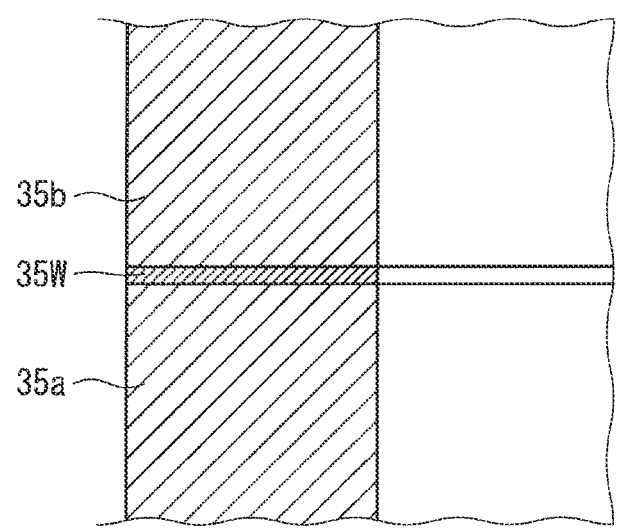
FIG. 30 is a partial cross-sectional view schematically showing the hollow tube in the first modification of the twelfth embodiment of the present invention.

FIG. 30 is a partial cross-sectional view schematically showing the vicinity of a boundary between the portion 35a and the portion 35b. The portion 35a and the portion 35b may be joined to each other by a welding layer 35W.

Figure 31:
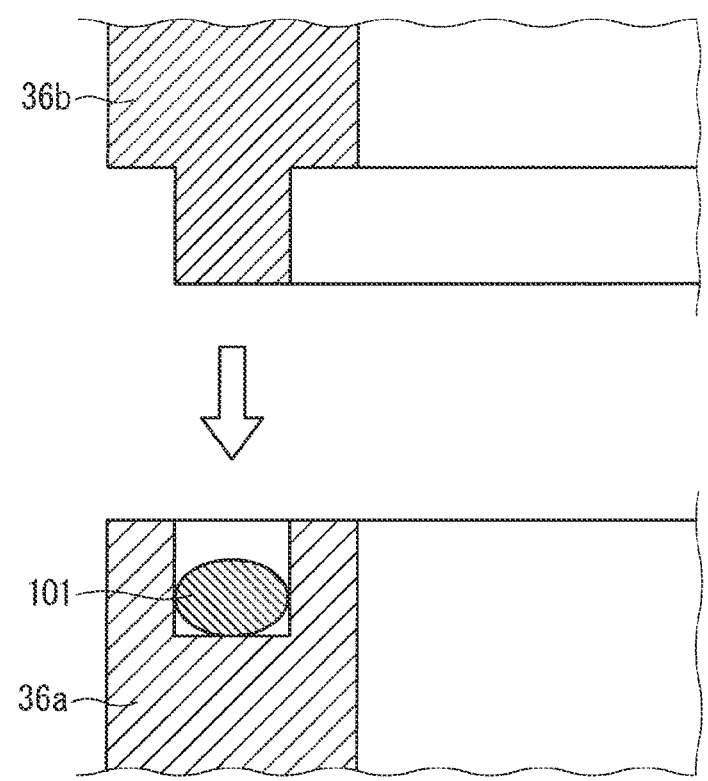
FIG. 31 is a partial cross-sectional view explaining a configuration of a hollow tube in a second modification of the twelfth embodiment of the present invention.

FIG. 31 is a partial cross-sectional view explaining a configuration of a hollow tube in a second modification. In the present modification, portions 36a and 36b are used in place of the portions 35a and 35b (FIG. 30), respectively. A recess and a protrusion for fitting the part 36a and the part 36b to each other are formed at locations where the portion 36a and the portion 36b face each other. The brazing member 101 is disposed in this recess. Note that an O-ring may be used instead of the brazing member 101. Alternatively, press-fitting may be performed.

Thirteenth Embodiment

Figure 32:
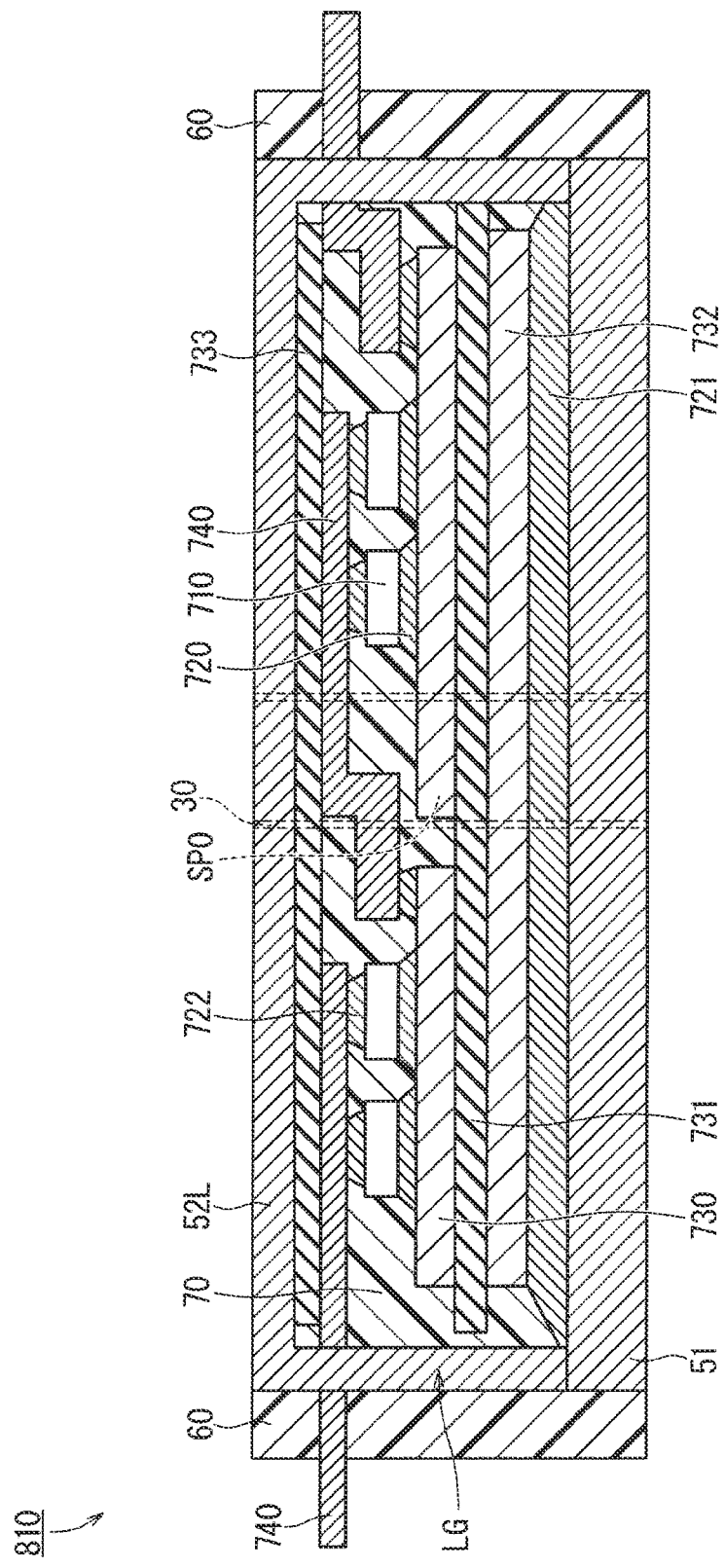
FIG. 32 is a cross-sectional view schematically showing a configuration of a semiconductor device (power module) according to a thirteenth embodiment of the present invention.

FIG. 32 is a cross-sectional view schematically showing a configuration of a power module 810 (semiconductor device) according to a thirteenth embodiment. The power module 810 has a second heat sink 52L. The second heat sink 52L has a leg LG extending toward the first heat sink 51. Accordingly, the first heat sink 51 and the second heat sink 52L are in contact with each other. The leg LG is preferably disposed on an outer circumference of the second heat sink 52L. Moreover, the leg LG is preferably frame-shaped in a flat layout.

According to the present embodiment, the first heat sink 51 and the second heat sink 52L are in contact with each other. In this case, heat diffusion is promoted between the first heat sink 51 and the second heat sink 52L. Accordingly, heat radiation performance of the first heat sink 51 and the second heat sink 52L improves as a whole. Therefore, the power module 810 with higher output is allowed to be operated. In addition, relative positions of the first heat sink 51 and the second heat sink 52L can be easily determined during manufacture. Accordingly, assemblability improves.

Fourteenth Embodiment

Figure 33:
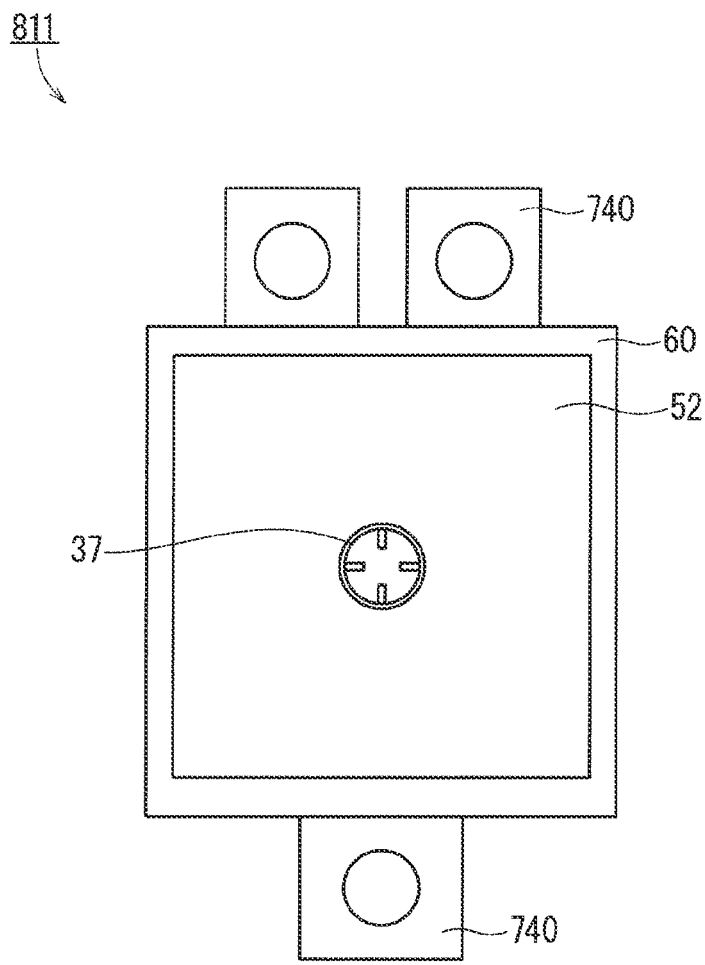
FIG. 33 is a plan view schematically showing a configuration of a semiconductor device (power module) according to a fourteenth embodiment of the present invention.
Figure 34:
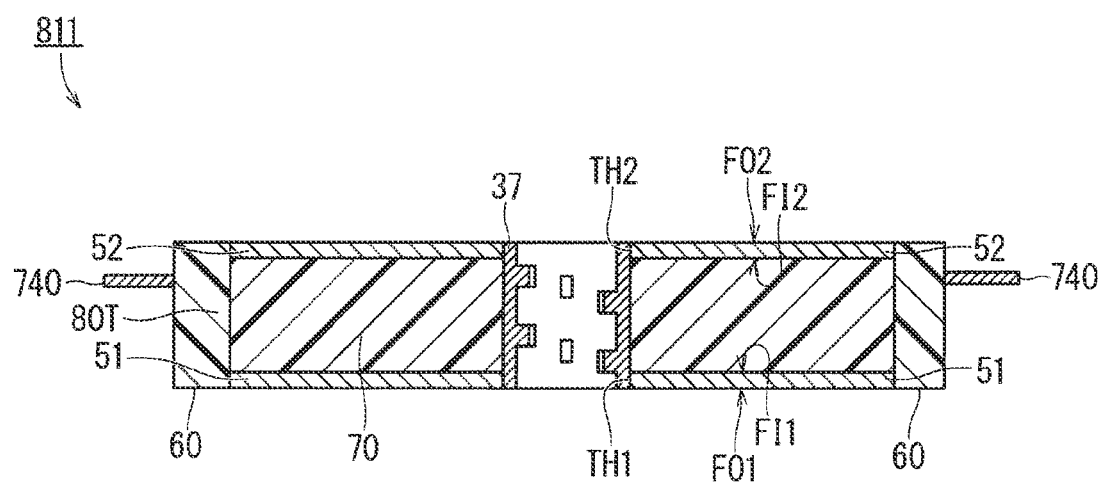
FIG. 34 is a cross-sectional view of FIG. 33.

FIG. 33 is a plan view schematically showing a configuration of a power module 811 (semiconductor device) according to a fourteenth embodiment. FIG. 34 is a cross-sectional view of the power module 811. The power module 811 includes a hollow tube 37 (first hollow tube). The hollow tube 37 includes an inner wall which has a structure having recesses and protrusions. Note that configurations other than the above are substantially the same as the configurations of the power module 801 (FIG. 6: first embodiment). Accordingly, the same or corresponding elements are designated by the same reference numerals, and description thereof will not be repeated. According to the present embodiment, heat radiation performance of the hollow tube 37 improves.

Therefore, the power module 811 with higher output is allowed to be operated.

Fifteenth Embodiment

Figure 35:
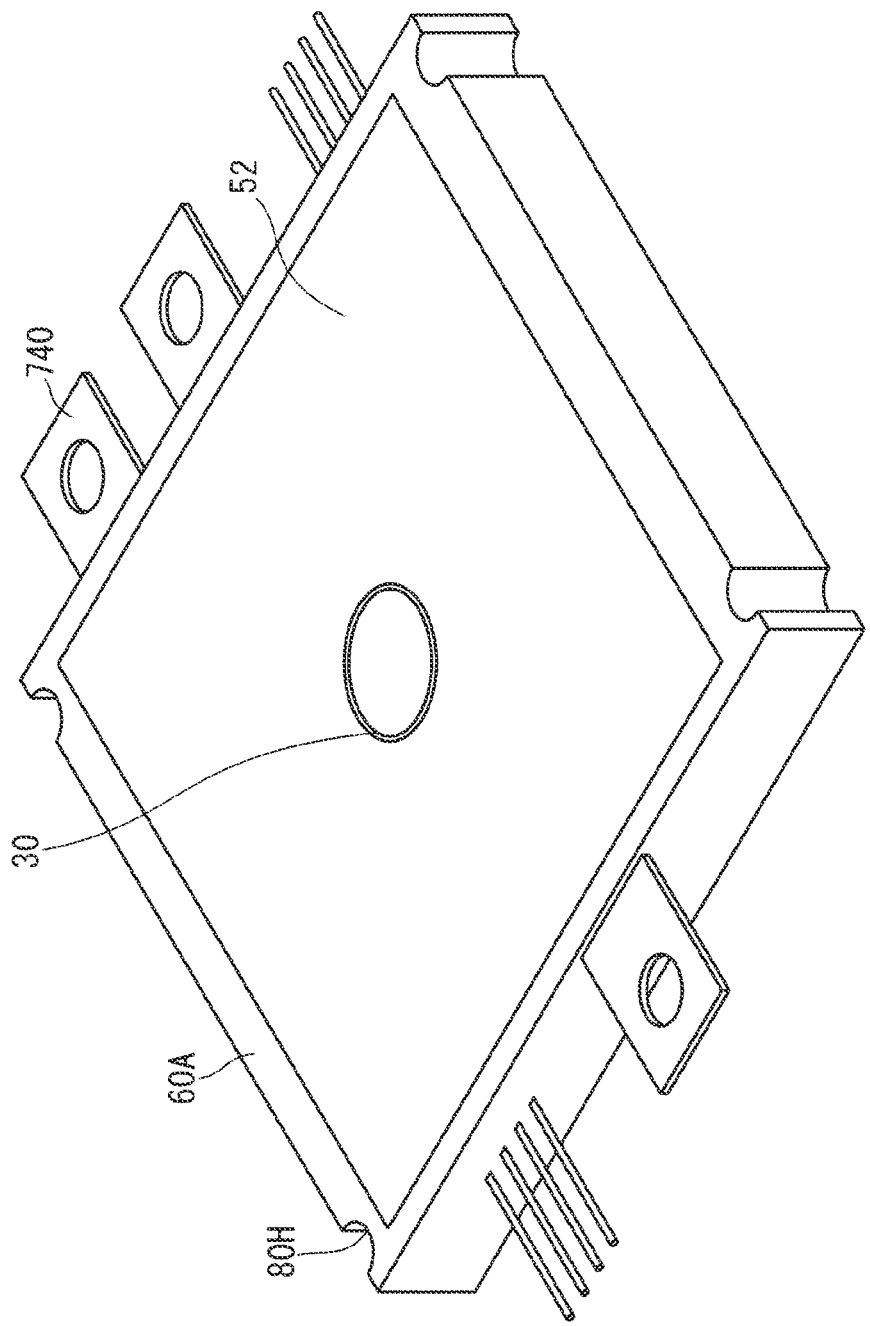
FIG. 35 is a perspective view schematically showing a configuration of a semiconductor device (power module) according to a fifteenth embodiment of the present invention.

FIG. 35 is a perspective view schematically showing a configuration of a power module 813 (semiconductor device) according to a fifteenth embodiment. The power module 813 has a case 60A. The case 60A has notches 80H which only partially surround the corresponding bolts 80 (see FIG. 3). The notches 80H are open to the case side surface unlike the bolt holes 80T (FIG. 6: first embodiment). For example, each of the notches 80H has an arcuate shape in a plan view. Note that configurations other than the above are substantially the same as the configurations of the power module 801 (FIG. 6: first embodiment). Accordingly, the same or corresponding elements are designated by the same reference numerals, and description thereof will not be repeated.

According to the present embodiment, the notches 80H which only partially surround the corresponding bolts 80 (see FIG. 3) are formed. Accordingly, the case 60A which is smaller than the case 60 having the bolt holes 80T is allowed to be used.

Therefore, the power module 813 can be more miniaturized.

Sixteenth Embodiment

Figure 36:
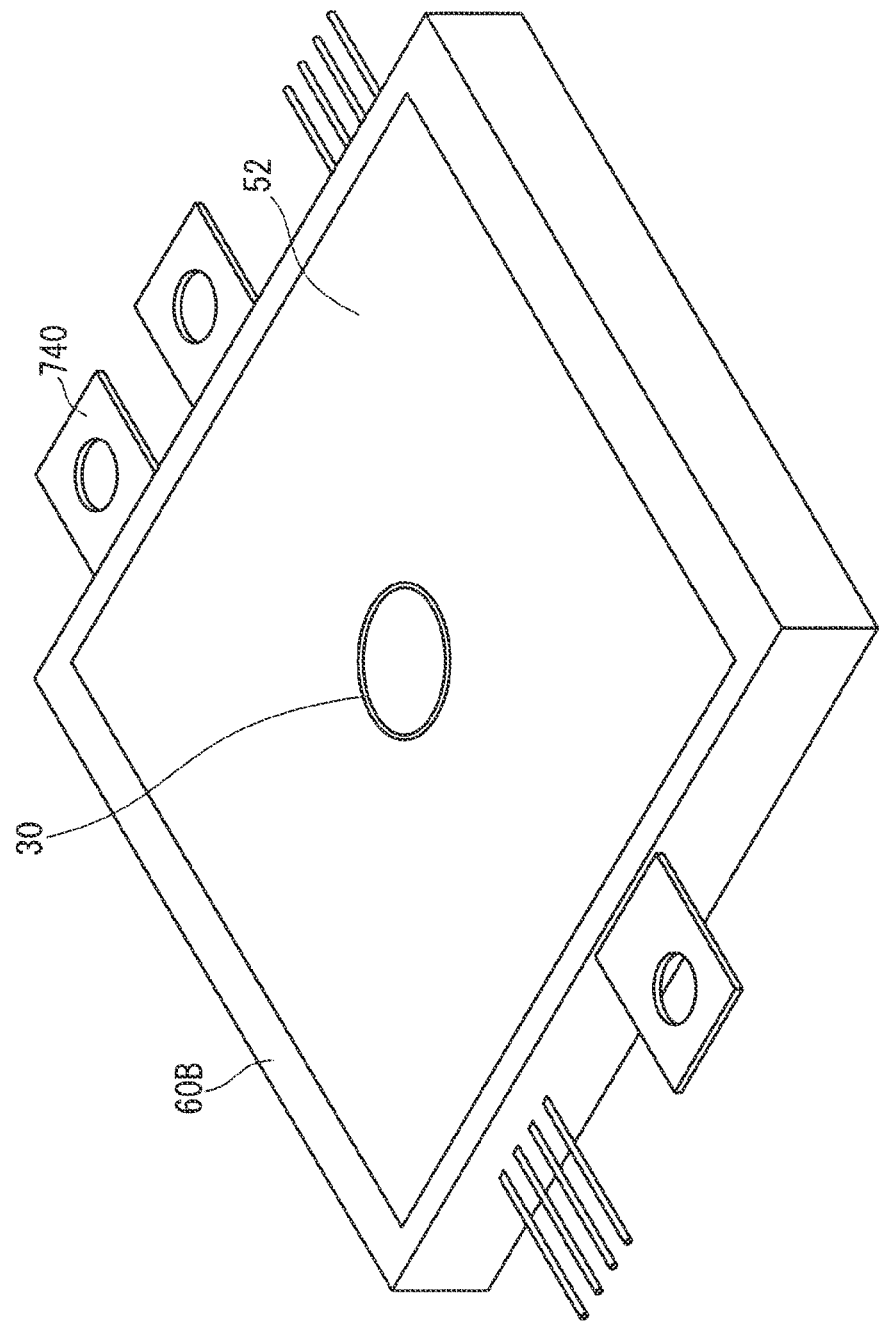
FIG. 36 is a perspective view schematically showing a configuration of a semiconductor device (power module) according to a sixteenth embodiment of the present invention.

FIG. 36 is a perspective view schematically showing a configuration of a power module 814 (semiconductor device) according to a sixteenth embodiment. The power module 814 has a case 60B. The case 60B has neither bolt holes 80T (FIGS. 1 and 6: first embodiment) nor the notches 80H (FIG. 35: fifteenth embodiment). Accordingly, the case 60B which is smaller than the case of the fifteenth embodiment can be obtained.

Figure 37:
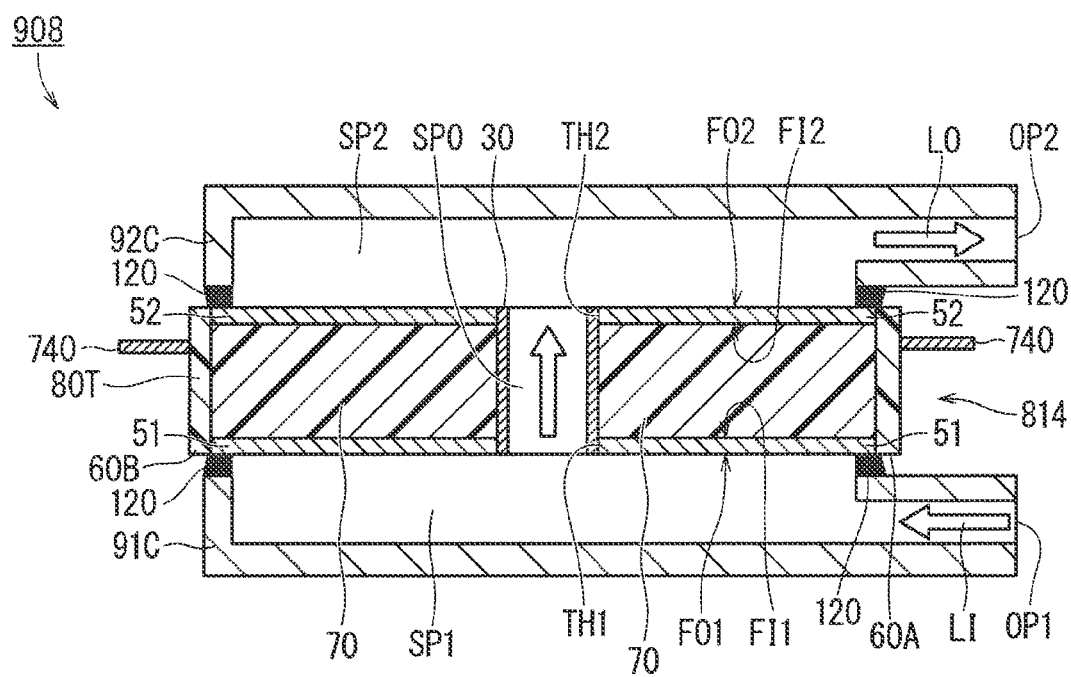
FIG. 37 is a cross-sectional view schematically showing a configuration of a semiconductor device (water-cooled module unit) according to the sixteenth embodiment of the present invention.

FIG. 37 is a cross-sectional view schematically showing a configuration of a water-cooled module unit 908 (semiconductor device) according to a sixteenth embodiment. In the water-cooled module unit 908, the first water cooling jacket 91C and the second water cooling jacket 92C are attached without using the bolts 80 (FIG. 1: first embodiment). Specifically, the first heat sink 51 is joined to the first water cooling jacket 91C to fix the first heat sink 51 to the first water cooling jacket 91C. Moreover, the second heat sink 52 is joined to the second water cooling jacket 92C to fix the second heat sink 52 to the second water cooling jacket 92C. This junction is performed using an adhesive 120, for example. Welding may be used instead of the adhesive 120.

Note that respective embodiments can be freely combined, or respective embodiments can be appropriately modified or eliminated within the scope of the present invention. The above detailed description of the present invention is presented only by way of example in all aspects, and the present invention is not limited to the description. It is understood that infinite variations not presented by way of example may be practiced without departing from the scope of the invention.

Explanation of Reference Signs
FI1: inner surface (first inner surface)
FI2: inner surface (second inner surface)
FO1: outer surface (first outer surface)
FO2: outer surface (second outer surface)
LG: leg
TH1: through hole (first through hole)
TH2: through hole (second through hole)
TH3: through hole (third through hole)
TH4: through hole (fourth through hole)
TH5, TH6: through hole
80H: notch
80T: bolt hole
OP1, OP2: opening
SP0: space
SP1: space (first space)
SP2: space (second space)
SP3: space (third space)
SP4: space (fourth space)
SP5: space
30, 30a to 30c, 30E, 30T, 31, 32, 34, 35, 37: hollow tube
35W, 132w, 152W: welding layer
740: electrode
51, 51T, 51a: first heat sink
52, 52a, 52L, 52T: second heat sink
55: fin structure
60, 60A, 60B: case
70: sealing member
80: bolts
91, 91A, 91B, 91C, 91M: first water cooling jacket
92, 92A, 92B, 92C: second water cooling jacket
93: third water cooling jacket
100: O-ring
120: adhesive
710: semiconductor element
730: circuit pattern
731: first insulating plate
732: conductor layer
733: second insulating plate
742: Cu block (metal block)
801 to 804, 805A to 805C, 806 to 811, 813, 814: power module (semiconductor device)
901 to 903, 904A to 904C, 905, 906, 906V, 907, 908: water-cooled module unit (semiconductor device)

The invention claimed is:

1. A semiconductor device comprising:
a first heat sink that has a first inner surface and a first outer surface opposite to the first inner surface, and has a first through hole between the first inner surface and the first outer surface;
a second heat sink that has a second inner surface disposed with a clearance left from the first inner surface of the first heat sink, and a second outer surface opposite to the second inner surface, and has a second through hole between the second inner surface and the second outer surface;
plural semiconductor elements disposed within the clearance between the first inner surface of the first heat sink and the second inner surface of the second heat sink;
a sealing member that seals the semiconductor element within the clearance between the first inner surface of the first heat sink and the second inner surface of the second heat sink; and
a first hollow tube that provides a passage for cooling water between the first and second heat sinks, is made of metal, and connects, through the sealing member, the first through hole of the first heat sink and the second through hole of the second heat sink, wherein
the first hollow tube is positioned between the plural semiconductor elements.

2. The semiconductor device according to claim 1, further comprising a first insulating plate disposed between the first heat sink and the semiconductor element.

3. The semiconductor device according to claim 2, wherein the first insulating plate is made of ceramics.

4. The semiconductor device according to claim 2, wherein the first insulating plate is made of resin.

5. The semiconductor device according to claim 1, further comprising a second insulating plate disposed between the second heat sink and the semiconductor element.

6. The semiconductor device according to claim 1, wherein the first hollow tube has an elliptical shape in an in-plane direction.

7. The semiconductor device according to claim 1, wherein the first hollow tube has a polygonal shape in an in-plane direction.

8. The semiconductor device according to claim 1, wherein the first outer surface of the first heat sink forms a space that has a shape tapered toward the first through hole.

9. The semiconductor device according to claim 1, wherein the first hollow tube has a tapered internal space.

10. The semiconductor device according to claim 1, wherein the first hollow tube and the first heat sink are continuously connected by a uniform material.

11. The semiconductor device according to claim 1, wherein the first heat sink and the second heat sink are in contact with each other.

12. The semiconductor device according to claim 1, wherein the first hollow tube has an inner wall that has a structure having a recess and a protrusion.

13. The semiconductor device according to claim 1, wherein the semiconductor element has a portion made of silicon carbide.

14. The semiconductor device according to claim 1, wherein:
the first heat sink has a third through hole between the first inner surface and the first outer surface; and
the second heat sink has a fourth through hole between the second inner surface and the second outer surface,
the semiconductor device further comprising a second hollow tube that is made of metal and connects the third through hole of the first heat sink and the fourth through hole of the second heat sink.

15. The semiconductor device according to claim 1, further comprising:
a first water cooling jacket that has a first space connected to the first through hole of the first heat sink; and
a second water cooling jacket that has a second space connected to the second through hole of the second heat sink.

16. The semiconductor device according to claim 15, further comprising a bolt that presses the second water cooling jacket toward the first water cooling jacket.

17. A semiconductor device comprising
a first heat sink that has a first inner surface and a first outer surface opposite to the first inner surface, and has a first through hole between the first inner surface and the first outer surface;
a second heat sink that has a second inner surface disposed with a clearance left from the first inner surface of the first heat sink, and a second outer surface opposite to the second inner surface, and has a second through hole between the second inner surface and the second outer surface;
a semiconductor element disposed within the clearance between the first inner surface of the first heat sink and the second inner surface of the second heat sink;
a sealing member that seals the semiconductor element within the clearance between the first inner surface of the first heat sink and the second inner surface of the second heat sink;
a first hollow tube that is made of metal and connects the first through hole of the first heat sink and the second through hole of the second heat sink;
a first water cooling jacket that has a first space connected to the first through hole of the first heat sink;
a second water cooling jacket that has a second space connected to the second through hole of the second heat sink;
a bolt that presses the second water cooling jacket toward the first water cooling jacket; and
a case through which the bolt passes.

18. The semiconductor device according to claim 15, wherein:
the first heat sink is joined to the first water cooling jacket to fix the first heat sink to the first water cooling jacket; and
the second heat sink is joined to the second water cooling jacket to fix the second heat sink to the second water cooling jacket.

19. A semiconductor device comprising:
a first heat sink that has a first inner surface and a first outer surface opposite to the first inner surface, and has a first through hole between the first inner surface and the first outer surface;
a second heat sink that has a second inner surface disposed with a clearance left from the first inner surface of the first heat sink, and a second outer surface opposite to the second inner surface, and has a second through hole between the second inner surface and the second outer surface;
a semiconductor element disposed within the clearance between the first inner surface of the first heat sink and the second inner surface of the second heat sink;
a sealing member that seals the semiconductor element within the clearance between the first inner surface of the first heat sink and the second inner surface of the second heat sink; and
a first hollow tube that is made of metal and connects the first through hole of the first heat sink and the second through hole of the second heat sink, wherein:
the first heat sink has a third through hole between the first inner surface and the first outer surface; and
the second heat sink has a fourth through hole between the second inner surface and the second outer surface,
the semiconductor device further comprising:
a second hollow tube that is made of metal and connects the third through hole of the first heat sink and the fourth through hole of the second heat sink;
a first water cooling jacket that has a first space connected to the first through hole of the first heat sink, and a third space connected to the third through hole of the first heat sink, and separates the first space from the third space; and
a second water cooling jacket that has a second space connected to the second through hole of the second heat sink.

20. The semiconductor device according to claim 19, wherein the second water cooling jacket has a fourth space connected to the fourth through hole of the second heat sink, and separates the second space from the fourth space.

* * * * *